(12) United States Patent
Hayamizu et al.

(10) Patent No.: US 7,649,921 B2
(45) Date of Patent: Jan. 19, 2010

(54) LASER MODULE

(75) Inventors: Naoki Hayamizu, Tokyo (JP); Yutaka Ohki, Tokyo (JP); Hideo Aoyagi, Tokyo (JP); Takeshi Koiso, Sodegaura (JP); Yuji Yamagata, Sodegaura (JP); Kiyofumi Muro, Chiba (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 654 days.

(21) Appl. No.: 10/982,855

(22) Filed: Nov. 8, 2004

(65) Prior Publication Data

US 2005/0123012 A1 Jun. 9, 2005

Related U.S. Application Data

(63) Continuation of application No. PCT/JP03/05766, filed on May 8, 2003.

(30) Foreign Application Priority Data

May 8, 2002 (JP) ............................. 2002-133219

(51) Int. Cl.
*H01S 3/00* (2006.01)
*H01S 3/08* (2006.01)
(52) U.S. Cl. ..................... 372/38.01; 372/102; 372/92
(58) Field of Classification Search ................ 372/6, 372/9, 20, 18, 102, 106
See application file for complete search history.

(56) References Cited

U.S. PATENT DOCUMENTS 3,789,317 A * 1/1974 Nishizawa ................. 372/8
4,380,075 A * 4/1983 Allen et al. ............... 372/44.01
4,727,555 A * 2/1988 Burnham et al. .......... 372/45.01
4,860,297 A * 8/1989 Hayakawa et al. ........ 372/45.01
4,899,360 A * 2/1990 Fujita et al. ............... 372/50.1
4,905,246 A * 2/1990 Hayakawa et al. ........ 372/45.01
4,910,738 A * 3/1990 Fujita et al. ................. 372/18

(Continued)

FOREIGN PATENT DOCUMENTS

EP 0 602 603 A2 6/1994

(Continued)

OTHER PUBLICATIONS

Kiyofumi Muro, "Development of High Power AlGa As Laser Diodes", Functional Material, vol. 17, No. 8, Aug. 1997, pp. 26-33 and (with English translation).

(Continued)

*Primary Examiner*—Minsun Harvey
*Assistant Examiner*—Patrick Stafford
(74) *Attorney, Agent, or Firm*—Oblon, Spivak, McClelland, Maier & Neustadt, L.L.P.

(57) ABSTRACT

A laser module includes a semiconductor laser element and a feedback optical component forming an external cavity with the semiconductor laser element. Even if a ratio of a current threshold of the laser module changing according to a polarized state of returned light from the feedback optical component to a current threshold of the semiconductor laser element is in an arbitrary range within a predetermined range, a total value of a relative intensity noise occurring between a first frequency determined according to a cavity length of the external cavity and at least equal to or more than a frequency band of using a laser light and a second frequency calculated by multiplying the first frequency by a predetermined number is equal to or more than −40 dB.

23 Claims, 17 Drawing Sheets

U.S. PATENT DOCUMENTS

| | | | | |
|---|---|---|---|---|
| 5,177,755 | A | * | 1/1993 | Johnson ................... 372/38.01 |
| 5,204,871 | A | * | 4/1993 | Larkins ................... 372/45.01 |
| 5,272,712 | A | * | 12/1993 | Arimoto et al. ........ 372/45.012 |
| 5,430,748 | A | * | 7/1995 | MacCormack et al. . 372/29.016 |
| 5,438,583 | A | | 8/1995 | Narui et al. |
| 5,485,481 | A | * | 1/1996 | Ventrudo et al. ................ 372/6 |
| 5,589,684 | A | * | 12/1996 | Ventrudo et al. ............ 250/225 |
| 5,642,375 | A | * | 6/1997 | King et al. .................... 372/97 |
| 5,953,358 | A | * | 9/1999 | Ishikawa et al. ........... 372/50.1 |
| 6,188,705 | B1 | * | 2/2001 | Krainak et al. ................ 372/32 |
| 6,205,161 | B1 | | 3/2001 | Kappeler |
| 6,356,572 | B1 | * | 3/2002 | Tanaka et al. ............ 372/45.01 |
| 6,545,296 | B1 | | 4/2003 | Mukaihara et al. |

FOREIGN PATENT DOCUMENTS

| | | |
|---|---|---|
| JP | 6-237045 A | 8/1994 |
| JP | 10-200195 A | 7/1998 |
| JP | 2000-223780 A | 8/2000 |
| JP | 2001-68789 A | 3/2001 |
| JP | 2003-60317 A | 2/2003 |
| JP | 2003-174226 A | 6/2003 |
| WO | WO 00/52795 A | 9/2000 |

OTHER PUBLICATIONS

Klaus Peterman, "Noise and Distortion Characteristics of Semiconductor Lasers in Optical Fiber Communication Systems" IEEE Journal of Quantum Electronics, vol. QE-18, No. 4, Apr. 1982, pp. 543-555.

James Guthrie, et al., "Beam Instability in 980-nm Power Lasers: Experiment and Analysis", IEEE Photonics Technology Letters, vol. 6, No. 12, Dec. 1994, pp. 1409-1411.

U.S. Appl. No. 11/384,559, filed Mar. 21, 2006, Ohki et al.

* cited by examiner

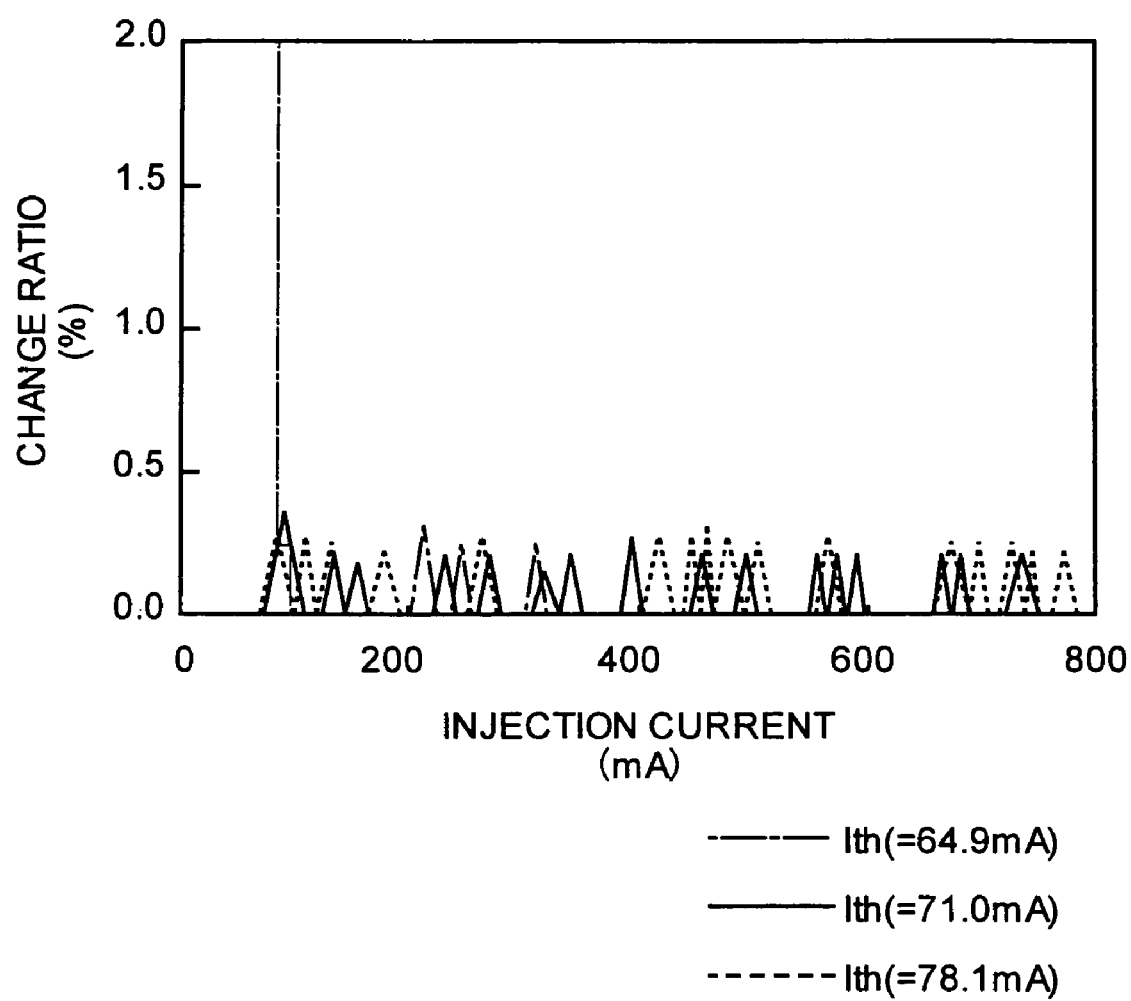

LASER MODULE

CROSS-REFERENCE TO RELATED APPLICATIONS

This application is a continuation of PCT/JP03/05766 filed on May 8, 2003, the entire content of which are incorporated herein by reference.

BACKGROUND OF THE INVENTION

1) Field of the Invention

The present invention relates to a laser module in which an external cavity is formed with a Fabry-Perot semiconductor laser element and an optical feedback component, and more particularly, to a laser module that is ideal for a pump light source for an optical amplifier.

2) Description of the Related Art

With a widespread of the Internet and a rapid increase in connections among corporate local area networks (LANs), an increase in data traffic has become an annoying problem. Also, to prevent a decrease in communication performance, dense wavelength division multiplexing (DWDM) transmission systems have made remarkable progress and become a common standard.

In the DWDM transmission system, with a plurality of optical signals being carried on different wavelengths, a large-capacity transmission, which is hundred times as large as a conventional transmission, is achieved using a single fiber. Also, in the DWDM transmission system, to achieve a wideband transmission and a long-distance transmission, use of an optical amplifier is essential. Particularly, as the optical amplifier for the DWDM transmission system, an erbium-doped fiber amplifier (EDFA) is widely in use. The EDFA is an optical fiber amplifier in which a pump laser light having a wavelength of a 1480-nanometer band or a 980-nanometer band propagates through a special optical fiber doped with an erbium. With the pump light propagating through the special optical fiber, a light having a wavelength of a 1550-nanometer band, which is transmission-signal light, is amplified.

Thus, such an optical fiber amplifier includes a laser module for generating the pump laser light. To achieve optical communication with high quality and high reliability in the DWDM transmission system, stable optical amplification has to be performed on the transmission signal light, which means that high quality is required for the laser module mentioned above.

In the laser module for a pump light source, a condition for satisfying high quality is high degree of being monochromatic in a single longitudinal mode. As a light source of a laser module, a semiconductor laser element is normally used. However, a Fabry-Perot semiconductor laser element oscillates in a plurality of longitudinal modes (multimode), and therefore cannot sufficiently satisfy the required monochromatic characteristic. The requirement on the monochromatic characteristic is similarly applied to a laser module for a signal light source. Particularly, if the monochromatic characteristic is not satisfied in the laser module for a pump light source, a gain band with respect to the transmission-signal light becomes fluctuated, thereby making it difficult to amplify wavelength-multiplexed signal light as designed.

Therefore, to satisfy the required monochromatic characteristic, which means to achieve oscillation in a single longitudinal mode, a system has been developed for practical use in which a fiber Bragg grating (FBG) having a predetermined reflection bandwidth is provided on a transmission path of laser light emitted from a semiconductor laser element.

The operation of the structure using the FBG is briefly described. Of the laser light emitted from the semiconductor laser element, a portion of a wavelength band specified by a reflection bandwidth of the FBG is reflected to become returned light. This returned light is again fed back to the semiconductor laser element. That is, a reflection facet (rear facet) of the semiconductor laser element and the FBG form an external cavity. With this, the wavelength of the laser light emitted from the semiconductor laser element, that is, the wavelength of the exiting laser light emitted from the laser module, is stabilized at a specific value.

Also, in the EDFA described above, specification requirements of the laser module include a stable response-frequency characteristic in low frequencies (on the order of equal to or less than 100 kHz). That is, a laser module capable of outputting light with small low-frequency noise is desired. Therefore, in the semiconductor laser element normally adopted as a light source of the laser module, a measure for reducing low-frequency noise is taken.

Well-known causes of the occurrence of low-frequency noise in light output from the semiconductor laser element include fluctuations in oscillation wavelength and mode hopping. The fluctuations in oscillation wavelength are caused by changes in cavity length mainly due to changes in temperature. The intensity of the oscillation-wavelength light follows the gain spectrum of the semiconductor laser element, and therefore if the oscillation wavelength is fluctuated, the intensity of the light output is also changed. This change in the light intensity makes its presence known as the low-frequency noise described above. Here, a temperature-change ratio and a coefficient of linear expansion of a refractive index of the FBG are low compared with those of the semiconductor. Therefore, if the FBG is adopted, fluctuations in oscillation wavelength caused by the changes in cavity length described above can be prevented to some extent.

On the other hand, even if the FBG is adopted, the problem of mode hopping mentioned above still remains. A gain peak (center wavelength of a gain spectrum) of the semiconductor laser element is normally changed due to changes in temperature or changes in injection current. Therefore, in some cases, the gain peak is located approximately at the midpoint between adjacent two longitudinal modes defined by the cavity length. In such cases, these longitudinal modes are alternately switched as an oscillation wavelength. This phenomenon is called mode hopping mentioned above. Normally, the oscillation intensity differs among different longitudinal modes, and therefore noise occurs according to the difference in intensity when the oscillation wavelength is switched. This noise makes its presence shown as the low-frequency noise mentioned above.

To suppress the occurrence of the low-frequency noise due to mode hopping, contrarily to the monochromatic requirement mentioned above, it is known that oscillation in a plurality of longitudinal modes (multimode) is effective (see IEEE Journal of Quantum Electronics, Vol. QE-18, No. 4, April 1982). Specifically, the state of a carrier inside the semiconductor laser element is changed by optical feedback, temperature changes, or changes in injection current to the semiconductor laser element to destroy temporal coherency in a single longitudinal mode, thereby extremely shortening a coherence length in the longitudinal mode. As such, a phenomenon in which oscillation in a plurality of longitudinal modes (multimode) is caused by optical feedback, temperature changes, or changes in injection current to the semiconductor laser element is generally called a "coherence collapse". Therefore, by causing such a coherence collapse, the occurrence of mode hopping can be reduced, thereby stabilizing the low frequencies of light output.

However, it has not been clear how much coherence collapse is required to stabilize the low frequencies of light output. A measure taken at present is merely causing a light output to be emitted for a predetermined period after the completion of the laser module for measuring temporal fluctuations in light output to see if the stability in low frequencies of the light output is within a predetermined range. In this measure, an index for determining the stability in low frequencies achieved by a coherence collapse cannot be obtained. Therefore, the stability check has to be performed on the completed laser module, which makes it difficult to select non-defective products at an early stage of the manufacturing process. Moreover, such a check requires a long time.

Also, to satisfy the required monochromatic characteristic by using the FBG in addition to oscillation in the longitudinal modes (multimode), it is preferable that the intensity in a longitudinal mode other than that of the FBG (main mode), particularly the intensity in oscillation wavelength (side mode) of the semiconductor laser element, is small. In other words, a ratio between the main mode and the side mode (side-mode suppression ratio: SMSR) is an important indicator. In the laser module, its design parameters are not independent from one another, but are closely related from one another. Therefore, if a parameter is changed to improve a certain characteristic, another characteristic may often be deteriorated. Therefore, it is difficult to find design parameters simultaneously satisfying a certain degree of a constant SMSR or higher with respect to various polarized states of laser light varying due to propagation through an optical fiber and the stability in low frequencies achieved by a coherence collapse.

Here, in a laser module using a GaAs-group semiconductor layer element, light-output fluctuations in laser light to be emitted are standardized to be equal to or less than 0.5%. Therefore, to satisfy this standard, unstable light outputs as described above pose a problem.

SUMMARY OF THE INVENTION

It is an object of the present invention to solve at least the above problems in the conventional technology.

A laser module according to one aspect of the present invention includes a semiconductor laser element and a feedback optical component forming an external cavity with the semiconductor laser element. Even if a ratio of a current threshold of the laser module changing according to a polarized state of returned light from the feedback optical component to a current threshold of the semiconductor laser element is in an arbitrary range within a predetermined range, a total value of a relative intensity noise occurring between a first frequency determined according to a cavity length of the external cavity and at least equal to or more than a frequency band of using a laser light and a second frequency calculated by multiplying the first frequency by a predetermined number is equal to or more than −40 dB.

According to the above aspect of the present invention, the semiconductor laser element is of a Fabry-Perot type with a layer structure including an active layer of a quantum well structure, oscillates in a plurality of longitudinal modes, and emits laser light satisfying a required monochromatic characteristic with a help of the external cavity. A light confinement coefficient per a well layer of the quantum well structure $\Lambda$ and a thickness of a well layer d in nanometer satisfy $\Gamma/d \leq 1.3 \times 10^{-3}$ nm$^{-1}$.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 14 is a graph of a relation between a fluctuation ratio of light outputs in the low frequency range and an injection current for each different polarized-light angle;

DETAILED DESCRIPTION

Exemplary embodiments of a laser module according to the present invention are described in detail with reference to the accompanying drawings. The present invention is not limited to these embodiments.

The laser module according to a first embodiment of the present invention includes a semiconductor laser element that adopts a decoupled confinement heterostructure (DCH structure), which will be described further below, as a pump light source, and also has a feature in which a relative intensity noise (RIN) in a high frequency range of light outputs has a value equal to or more than a predetermined value. Particularly, the inventors have found that the RIN having a value equal to or more than the predetermined value brings stability in low frequencies caused by the occurrence of a coherence-collapse phenomenon. The laser module according to the first embodiment is designed based on the findings, that is, the relationship between the RIN in a high frequency range and the stability in low frequencies.

Figure 1:
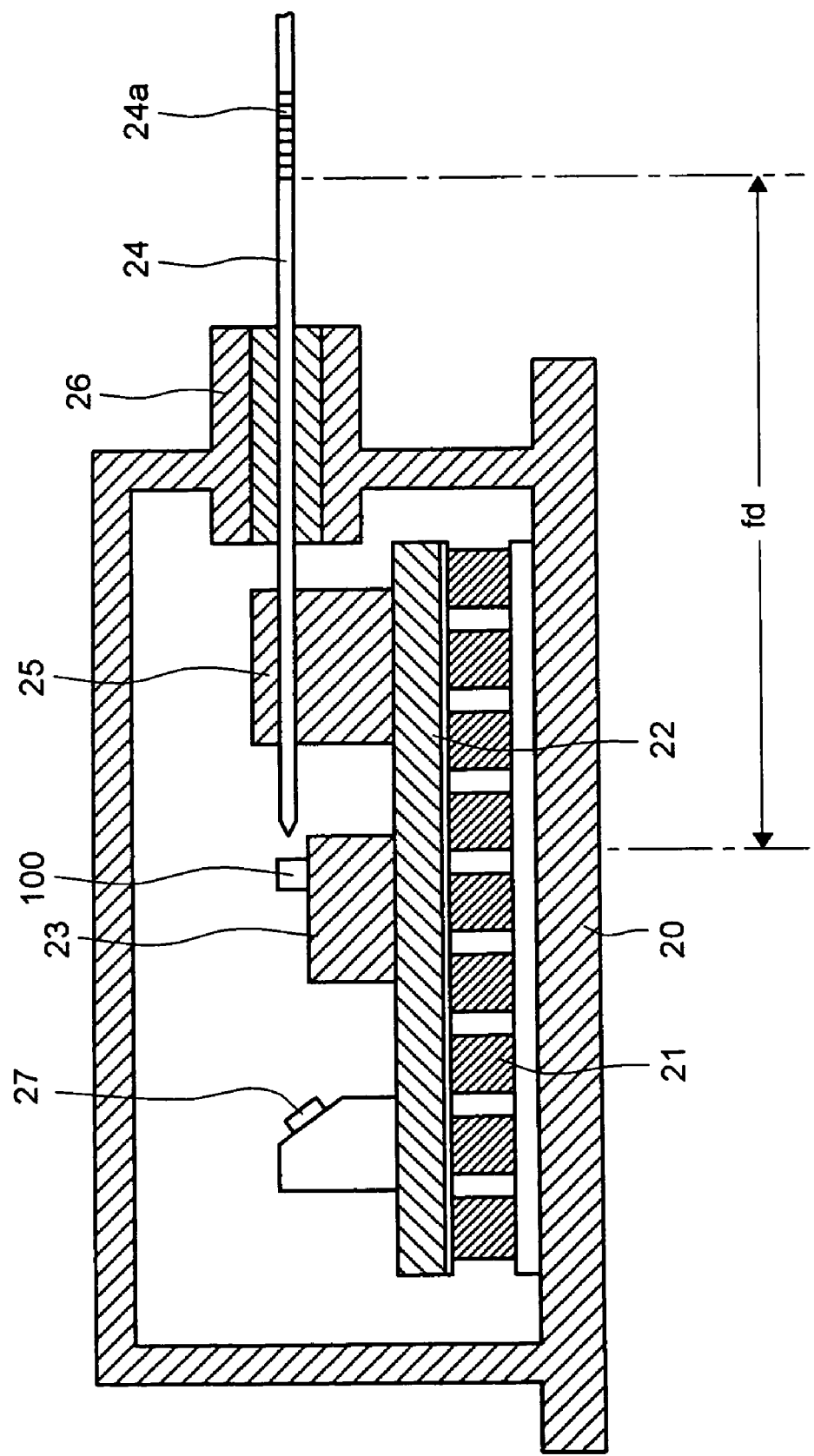
FIG. 1 is a cross section of a laser module according to a first embodiment of the present invention.

FIG. 1 is a cross section of a laser module according to a first embodiment of the present invention. In the laser module according to the first embodiment, a Peltier module 21 is disposed on a baseplate of a package 20 for cooling a semiconductor laser element 100. Furthermore, on the Peltier module 21, a base 22 made of Kovar, for example, is disposed. On the base 22, the semiconductor laser element 100 is disposed via a carrier 23. This semiconductor laser element 100 is optically connected to an optical fiber 24 with a lens-shaped tip and an FBG 24a.

The optical fiber 24 is fixed onto the base 22 by a ferrule 25, and is also extended at the light-emitting end side from the package 20 via a sleeve 26 hermetically mounted inside a cylindrical opening of the package 20. Also, on a back surface side of the semiconductor laser element 100, a photodiode 27 is placed. With this photodiode 27, the magnitude of a light output of the laser module is monitored.

Here, in place of the optical fiber 24, an optical fiber with its tip being not lens-shaped and having the FBG 24a may be used. In this case, to improve efficiency in optical coupling between the semiconductor laser element 100 and the optical fiber, a lens is placed between the semiconductor laser element 100 and the optical fiber. Also, if a wedge-shaped optical fiber is used as the optical fiber, a laser module with a high efficiency in optical coupling and a small number of components required for assembly can be provided, thereby resultantly reducing a total manufacturing cost.

Figure 2:
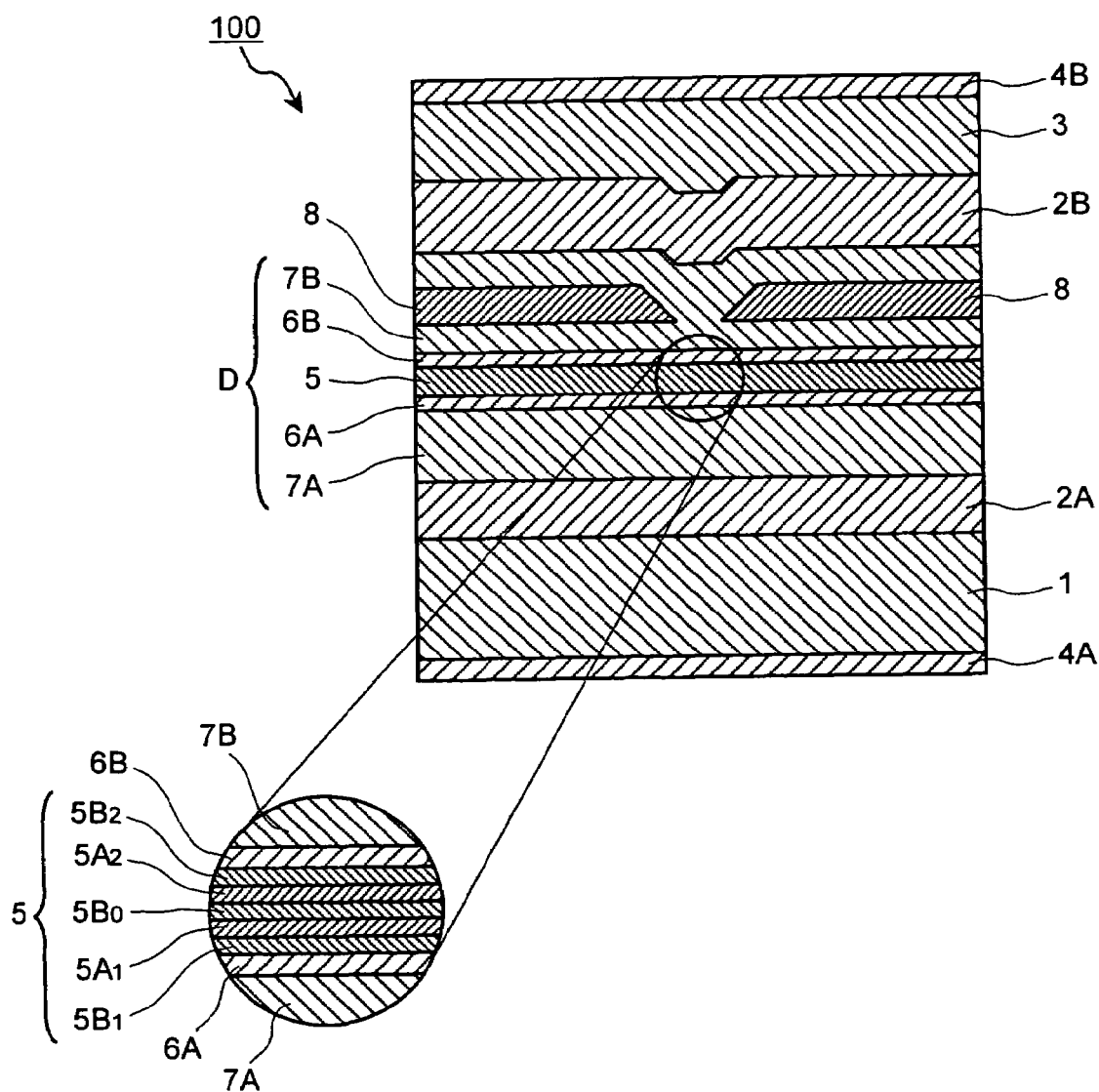
FIG. 2 is a cross section of a semiconductor laser element in the laser module according to the first embodiment.

Next, the structure of the semiconductor laser element is described. FIG. 2 is a cross section of the semiconductor laser element 100, particularly depicting a section parallel to an emitting-facet. The semiconductor laser element 100 shown in FIG. 2 has a so-called self-aligned structure (SAS) structure and, particularly, similar in a longitudinal direction to that of a Fabry-Perot semiconductor laser having a predetermined cavity length.

As shown in FIG. 2, in this semiconductor laser element 100, a lower clad layer 2A made of n-GaAs is formed on a substrate 1 made of, for example, n-GaAs. On that layer, a layer structure D, which will be described further below, is further formed. On the layer structure D, an upper clad layer 2B made of p-AlGaAs and a contact layer 3 made of p-GaAs are sequentially formed. An n-type electrode 4A is formed on the back surface of the substrate 1, while a p-type electrode 4B is formed on the contact layer 3.

The layer structure D is a layer structure suggested as a decoupled confinement heterostructure (DCH structure) described in "Functional Material, vol. 17, No. 8, pp. 26-33 (August edition, 1997). That is, the layer structure D includes, as shown in FIG. 2, an active layer 5 having a quantum-well structure. The active layer 5 includes two well layers $5A_1$ and $5A_2$ made of InGaAs and three barrier layers $5B_0$, $5B_1$, and $5B_2$ made of AlGaAs and disposed on both sides of each well layer.

On the outside of the barrier layer $5B_1$ located at the bottom layer of the active layer 5, a lower carrier blocking layer 6A made of n-AlGaAs with a band-gap energy larger than that of the other layers is disposed. Similarly, on the outside of the barrier layer $5B_2$ located at the top layer of the active layer 5, an upper carrier blocking layer 6B made of p-AlGaAs with a band-gap energy larger than that of the other layer is disposed. Furthermore, on the outside of the lower carrier blocking layer 6A, a lower-light confining layer 7A made of n-GaAs is disposed. On the outside of the upper carrier blocking layer 6B, an upper-light confining layer 7B made of p-GaAs is disposed. Hereinafter, in the following description, the barrier layers $5B_1$ and $5B_2$ located at the both ends of the active layers 5 are referred to as side barriers.

In the middle of a thickness direction of the upper-light confining layer 7B, a current blocking layer 8 made of n-AlGaAs is disposed to extend in a width direction of the upper-light confining layer 7B except a center portion in the width direction. With this, highly-efficient injection from the p-type electrode 4B to the active layer 5 is achieved.

Figure 3:
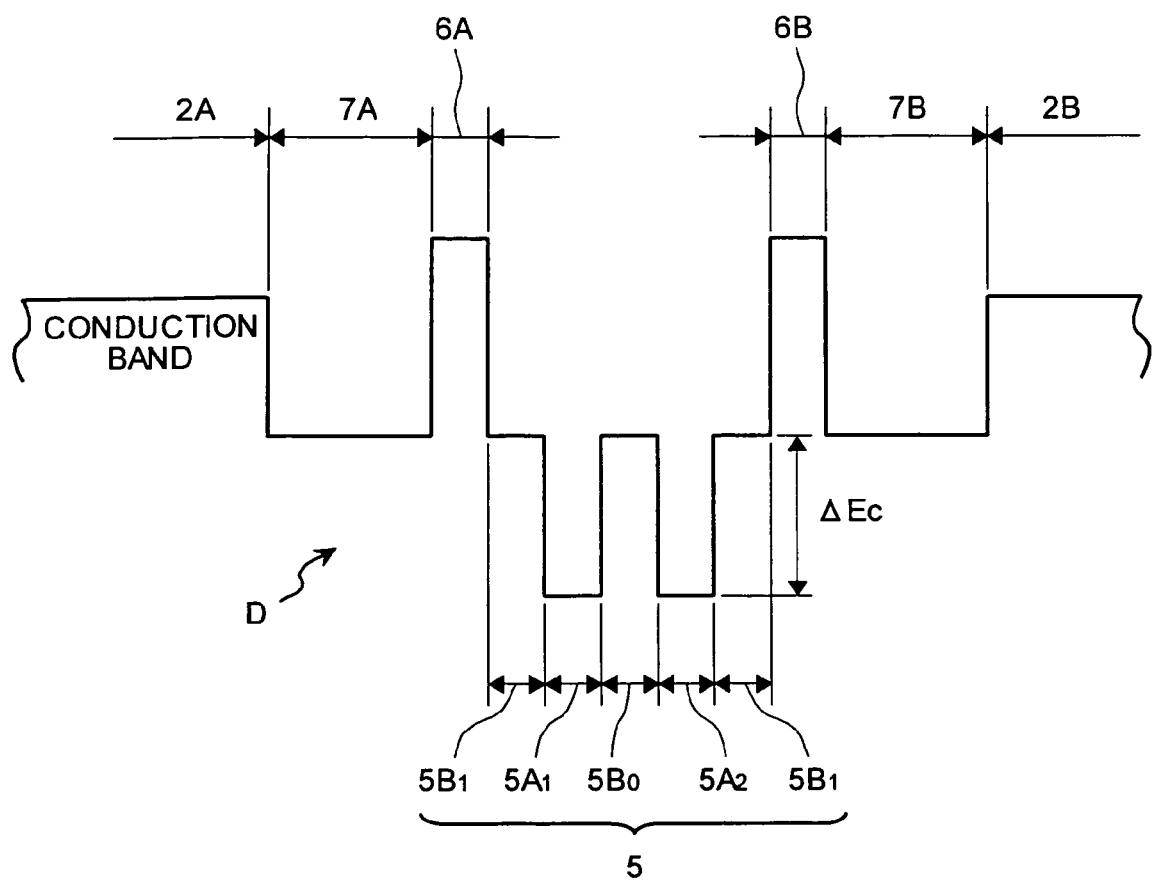
FIG. 3 is a schematic diagram as an example of a band diagram of a DCH structure.

FIG. 3 is a schematic diagram as an example of a band diagram of a DCH structure. In the layer structure D shown in the band structure diagram of FIG. 3, a carrier injected to the active layer 5 is efficiently confined in the active layer 5 by a band gap between the carrier blocking layers 6A and 6B positioned on both sides of the active layer without being diffused to the outside, thereby contributing oscillation of laser light. Then, the laser light is waveguided as being confined as a whole in this DCH structure. That is, in this DCH structure, the light confining layers 7A and 7B positioned on the sides of the carrier blocking layers 6A and 6B function as optical waveguide layers.

Next, design parameters of the semiconductor laser element 100 having the DCH structure as described above are described. First, when the thickness of the well layer 5A, and that of the well layer $5A_2$ are each taken as d (nanometers) and a light confinement coefficient for each well layer is taken as Γ, the thickness d and the light confinement coefficient Γ are designed so that the following relation holds:

$$\Gamma/d \leq 1.3 \times 10^{-3} \text{ nm}^{-1} \quad (1)$$

Only when this relation holds, as described further below, the laser module having the semiconductor laser element 100 oscillates in a plurality of longitudinal modes (multimode) with respect to all injection currents to the semiconductor laser element 100, and its light outputs are temporally stabilized.

Here, assuming that the above equation (1) holds, the thickness (d) of each of the well layers $5A_1$ and $5A_2$ is preferably designed to be equal to or more than 8.5 nanometers. With the thickness of each well layer being designed as such, in addition to a base level, a higher-order level is present in the formed quantum well. A part of the carrier injected from the p-type electrode 4B is captured at the higher-order level and, as a result, a ratio of a net increase in gain to the amount of injection current becomes decreased. In other words, as the thickness d is larger, disturbance to the semiconductor laser element due to a subtle change in oscillation gain based on returned light is increased, thereby making a coherence-collapse phenomenon more prone to occur. As a result, oscillation in a plurality of longitudinal modes (multimode) can be achieved.

Here, the thickness of the well layer is defined by a critical film thickness of the semiconductor material for use in forming the well layer. However, even if the thickness is smaller than the critical film thickness, a too large thickness will start oscillation at the second quantum level to invite deterioration of laser light. Therefore, the thickness is preferably on the order of 12 nanometers at the maximum.

Upon determination of the thickness d of each of the well layer, the light confinement coefficient Γ for the well layers is determined accordingly to satisfy the Eq. (1). Further, the type, composition, etc., of the semiconductor material for use in laminating the well layers are selected.

Also, in the active layer 5 of the layer structure D, as shown in FIG. 3, it is preferable that a difference ΔEc between a band-gap energy in a conduction band of the barrier layer $5B_0$ ($5B_1$, $5B_2$) and a band-gap energy in a conduction band of the well layer $5A_1$ ($5A_2$) be equal to or less than 170 million electron volts.

As the difference ΔEc in band-gap energy in the conduction band is smaller, a coherence-collapse phenomenon is more prone to occur, thereby achieving oscillation at a plurality of longitudinal modes (multimode). However, a too small ΔEc causes an overflow of an injection carrier. Therefore, ΔEc is preferably set to be on the order of 95 million electron volts at the minimum.

The cavity length L of the semiconductor laser element 100 is not particularly restricted. However, to achieve high outputs, the cavity length L is preferably designed to be equal to or more than 1500 micrometers.

In the semiconductor laser element according to the present invention, the stripe width in the current blocking layer is optimized so that most of the injection carrier is included in a profile area of oscillation laser light. Specifically, the stripe width is designed to be equal to or less than 3.5 micrometers. Design principles for this are described below.

The design principles for the laser element according to the present invention are that, as described above, design is made to reduce the occurrence of laser oscillation in the active-layer structure, thereby achieving oscillation laser light in multimode. Thus, because of the design principles on which the design is based, the laser element to be manufactured has to be provided with consideration of maintaining a high kink output.

For example, when Γ is designed to be small and d is designed to be large (the well layer is thick) as the laser element according to the present invention, a so-called oscillation-threshold carrier density is high. Therefore, irrespectively of the layer structure, a fluctuation in the refractive index is relatively large with respect to a fluctuation in carrier density. With this, so-called hole burning is generally conspicuous. Consequently, the longitudinal mode becomes unstable from the low-output driving stage, thereby making a kink phenomenon more prone to occur.

For the reasons mentioned above, in the semiconductor laser according to the present invention, a measure against such a hole burning phenomenon is required. Specifically, the stripe width (W) of the current blocking layer 8 disposed above the active layer 5 is optimized, thereby suppressing the occurrence of the hole burning phenomenon.

Here, the profile area of the oscillation laser light is determined based on the stripe width formed in the laser element and an effective refractive-index difference between the inside of the stripe and other areas occurring mainly due to the laser structure, such as the formation of the current blocking layer. In the semiconductor laser element having the current blocking layer, the stripe width of the current blocking layer is designed to be generally on the order of 4 to 6 micrometers.

However, according to IEEE, Photonics Technology Letters, vol. 6, No. 12, pp. 1409 to 1411, 1994, in such a semiconductor laser element, the injection carrier is diffused in a horizontal direction of the active layer, and such a carrier distribution area is wider than the profile area of the oscillation laser light. Starting with this, in the semiconductor laser element, the profile of the oscillation laser light becomes unstable at the time of high-output driving. That is, a high-output characteristic of the semiconductor laser element is impaired.

Therefore, to stabilize the profile of the oscillation laser light even at the high-output driving, if such a state is achieved as that in which an injection-carrier distribution area is included in the profile area of the oscillation laser light, it would be possible to suppress hole burning and achieve a high kink output.

This would be achievable by sufficiently narrowing the stripe width in the current blocking layer to narrow the injection-carrier distribution area.

In view of this, as described further below, a relation between the stripe width and a kink output was examined. It was found that, in the semiconductor laser element according to the present invention, if the stripe width is designed to be equal to or less than 3.5 micrometers, hole burning is effectively suppressed even at the time of high-output driving over 200 milliwatts, for example.

Here, in this case, to maintain the size of the profile area of the oscillation laser light approximately constant, the effective refractive-index difference between the inside of the stripe and other areas have to be appropriately adjusted correspondingly to the stripe width.

In manufacturing the semiconductor laser element 100, a semiconductor material for forming each layer is selected to satisfy design items as listed above. As possible semiconductor materials, a. GaAs group, an AlGa group, an AlGaAs group, or an InGaNAs group can be used, for example. Also, by selecting a type and a composition of these materials and a thickness at the time of lamination, the requirement for each design item described above can be satisfied.

For example, if $Al_xGa_{1-x}As$ (x is a number equal to or more than 0 and is less than 0.1) is used as the side barrier layers $5B_1$ and $5B_2$ in the active layer 5, oscillation at a plurality of longitudinal modes (multimode), that is, stabilization of light outputs, can be achieved. Particularly, forming the side barrier layers with GaAs is suitable.

Laser elements A1 having the DCH structure and the layer structure as a whole shown in FIG. 2 were made. Specifications for each layer are as shown in Table 1. Here, the cavity length (L) is 2100 micrometers each. Also, for each laser element, a reflectivity at the front-facet was set to 2%, and a reflectivity at the rear-facet was set to 96%. Furthermore, the stripe width of the current blocking layer 8 was set to 3.2 micrometers each.

TABLE 1

| Semiconductor laser element | | Sample 1 | Sample 2 | Sample 3 | Compared example |
|---|---|---|---|---|---|
| Substrate 1 | Material | n-GaAs | n-GaAs | n-GaAs | n-GaAs |
| | Thickness (nm) | $1 \times 10^5$ | $1 \times 10^5$ | $1 \times 10^5$ | $1 \times 10^5$ |
| Lower clad layer 2A | Material | n-AlGaAs | n-AlGaAs | n-AlGaAs | n-AlGaAs |
| | Thickness (nm) | 2355 | 2200 | 2750 | 900 |

TABLE 1-continued

| Semiconductor laser element | | | Sample 1 | Sample 2 | Sample 3 | Compared example |
|---|---|---|---|---|---|---|
| Layer structure D | Lower-light confining layer 7A | Material | n-GaAs | n-GaAs | n-GaAs | n-GaAs |
| | | Thickness (nm) | 520 | 470 | 550 | 330 |
| | Lower-carrier blocking layer 6A | Material | n-AlGaAs | n-AlGaAs | n-AlGaAs | n-AlGaAs |
| | | Thickness (nm) | On the order of 10–100 | On the order of 10–100 | On the order of 10–100 | On the order of 10–100 |
| | Active layer 5 | Side barrier layer $5B_1$ | Material | i-GaAs | i-GaAs | i-GaAs | i-GaAs |
| | | | Thickness (nm) | 55 | 55 | 50 | 55 |
| | | Well layer $5A_1$ | Material | i-InGaAs | i-InGaAs | i-InGaAs | i-InGaAs |
| | | | Thickness (nm) | 8.5 | 10 | 12 | 10 |
| | | Side barrier layer $5B_0$ | Material | i-GaAs | i-GaAs | i-GaAs | i-GaAs |
| | | | Thickness (nm) | 6 | 6 | 6 | 6 |
| | | Well layer $5A_2$ | Material | i-InGaAs | i-InGaAs | i-InGaAs | i-InGaAs |
| | | | Thickness (nm) | 8.5 | 10 | 12 | 10 |
| | | Side barrier layer $5B_2$ | Material | i-GaAs | i-GaAs | i-GaAs | i-GaAs |
| | | | Thickness (nm) | 55 | 55 | 50 | 55 |
| | Lower-carrier block layer 6B | Material | p-AlGaAs | p-AlGaAs | p-AlGaAs | p-AlGaAs |
| | | Thickness (nm) | On the order of 10–100 | On the order of 10–100 | On the order of 10–100 | On the order of 10–100 |
| | Lower-light confining layer 7B | Material | p-GaAs | p-GaAs | p-GaAs | p-GaAs |
| | | Thickness (nm)(*) | 520 | 470 | 550 | 40 |
| Current blocking layer 8 | | Material | n-AlGaAs | n-AlGaAs | n-AlGaAs | n-AlGaAs |
| | | Thickness (nm) | 10–300 | 10–300 | 10–300 | 10–300 |
| Upper clad layer 2B | | Material | p-AlGaAs | p-AlGaAs | p-AlGaAs | p-AlGaAs |
| | | Thickness (nm) | 780 | 800 | 820 | 900 |
| Contact layer 3 | | Material | p-GaAs | p-GaAs | p-GaAs | p-GaAs |
| | | Thickness (nm) | $1.7 \times 10^3$ | $1.7 \times 10^3$ | $1.7 \times 10^3$ | $1.7 \times 10^3$ |

(*)In FIG. 2, the entire thickness including the current blocking layer

Therefore, Γ and Γ/d in semiconductor laser elements in first to third samples and a compared example are as shown in Table 2.

TABLE 2

| | Γ | Γ/d × $10^{-3}$ ($nm^{-1}$) |
|---|---|---|
| Sample 1 | 0.00597 | 0.702 |
| Sample 2 | 0.00767 | 0.767 |
| Sample 3 | 0.00807 | 0.673 |
| Compared example | 0.02873 | 1.429 |

With the use of the semiconductor laser elements in first to third samples, the laser modules as shown in FIG. 1 were assembled. Here, the FBG optically coupled to the semiconductor laser was designed to have a wavelength selection characteristic with a reflectivity of 4%, a reflective bandwidth of 0.5 nanometers, and a center wavelength of 975 nanometers.

Figure 4:
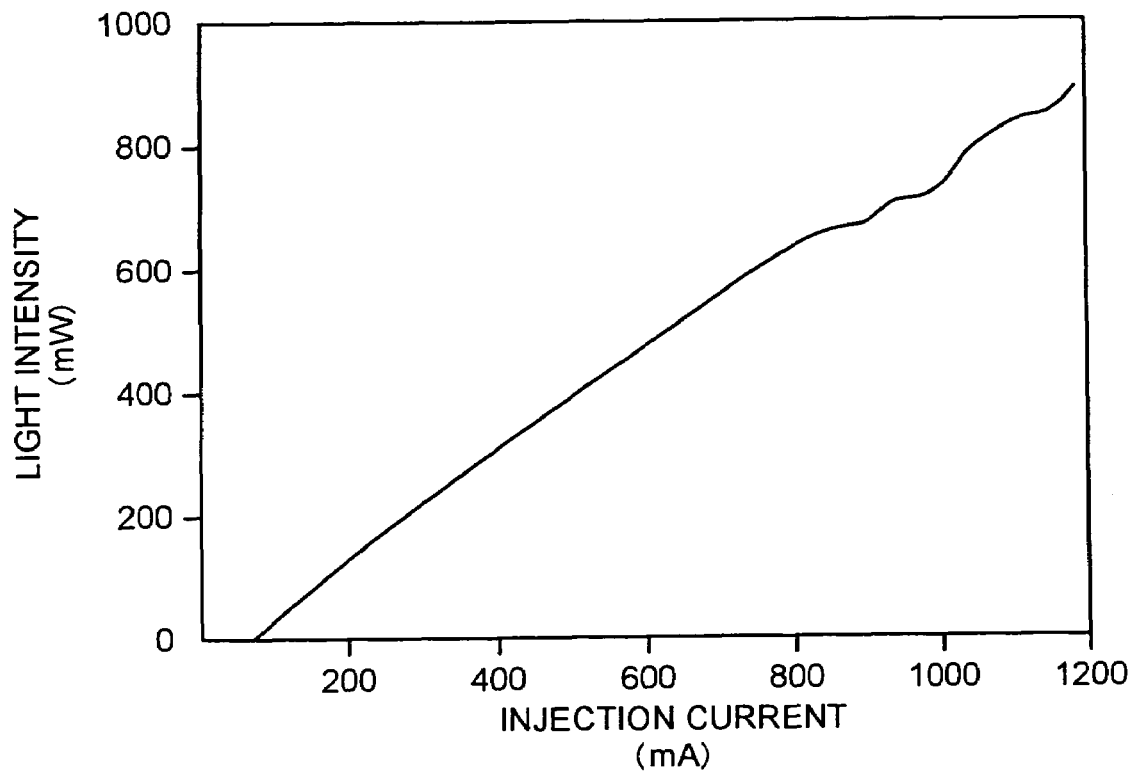
FIG. 4 is a graph of a light-current (LI) characteristic of a semiconductor element of a second sample.

FIG. 4 is a graph of results obtained by measuring, in a laser module having incorporated therein a semiconductor laser element of the second sample, a light-current (LI) characteristic of the semiconductor laser element. As evident from FIG. 4, this laser element emits laser light with high light output in an extremely stable state until the injection current reaches 800 milliamperes.

Figure 5:
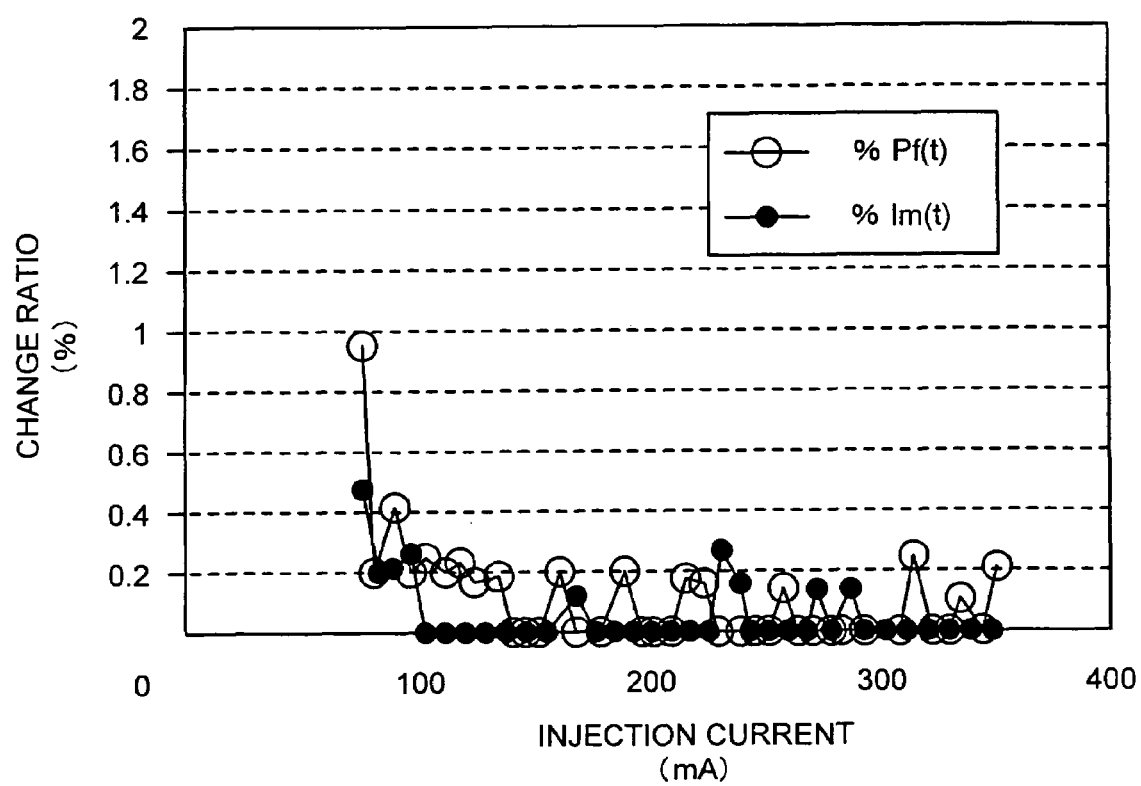
FIG. 5 is a graph of a Pf changing ratio and an Im changing ratio of a laser module having the semiconductor element of the second sample.

FIG. 5 is a graph of results obtained by measuring a light output (Pf) from the laser module and a monitor light intensity (lm) every time an injection current of the semiconductor laser element of the second sample is increased by every 5 milliamperes and calculating each change ratio (%).

As evident from FIG. 5, in this semiconductor laser element, the change ratio in light output is equal to or less than 0.5% even if the injection current is changed. Therefore, the stability in light output to the injection current is excellent.

Figure 6:
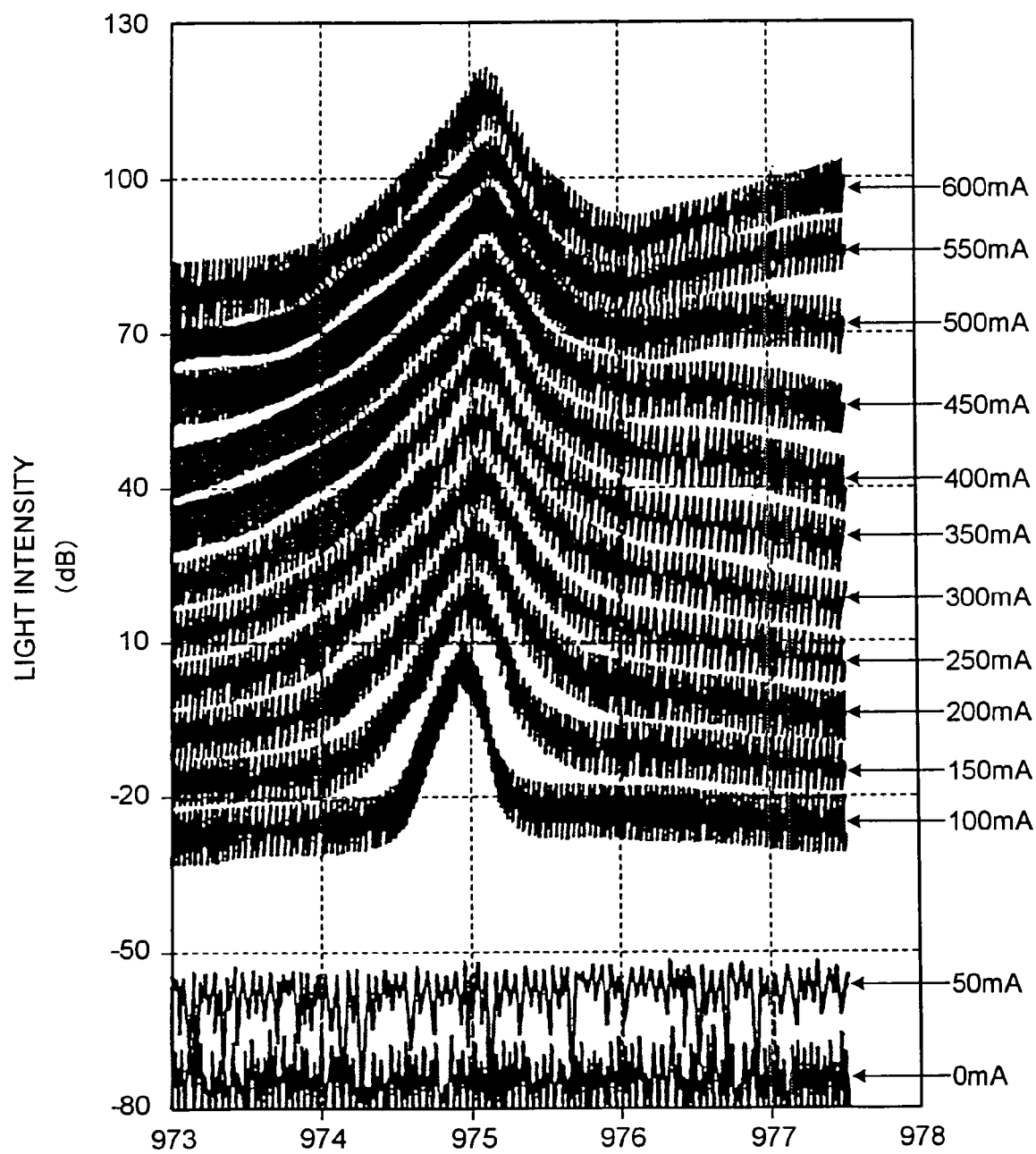
FIG. 6 is a graph of oscillation spectrums with different injection currents.

FIG. 6 is a graph of measurement results of oscillation spectrums of oscillation laser light at the time after five seconds has elapsed from the start of driving the element in each varied injection current to the semiconductor laser element of the second sample. As evident from FIG. 6, in this semiconductor laser element, oscillation occurs in a plurality of longitudinal modes (multimode) at each of injection-current values.

Figure 7:
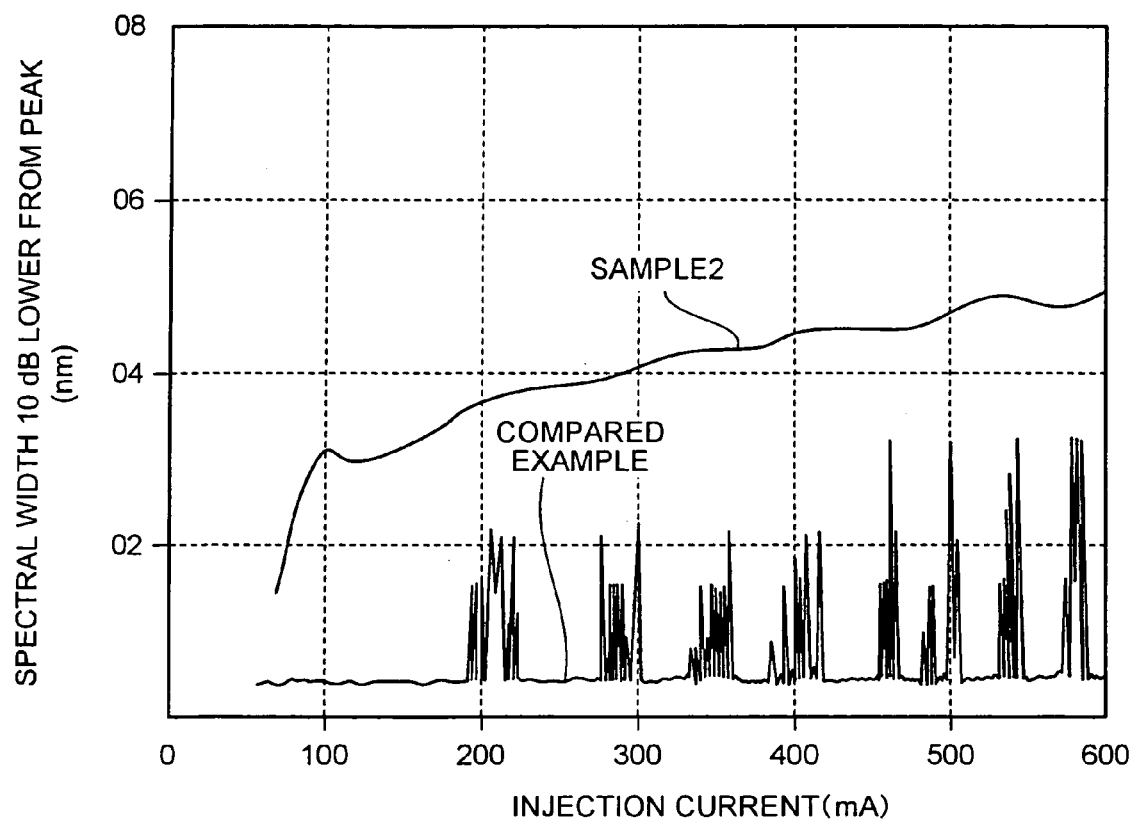
FIG. 7 is a graph of a relation between an injection current and a spectral width induced from the oscillation spectrum shown in FIG. 6.

FIG. 7 is a graph of results obtained by reading a spectral width (nanometers) of each oscillation spectrum of FIG. 6 at a light-output value 10 dB lower from the peak value and plotting the read value with respect to the relevant injection current.

Similarly to the above, FIG. 7 also indicates results obtained by reading a spectral width of each oscillation spectrum of the laser element of the compared example at a value 10 dB lower from the peak value.

As evident from FIG. 7, as for the semiconductor laser element of the second sample, fluctuations in the spectral width as described above is small even if the injection current is changed, and multimode oscillation is maintained. On the contrary, as for the laser element of the compared example, its spectral width is significantly fluctuated, and single-mode oscillation often occurs.

Similar tests were also performed on the semiconductor laser elements of the first and third samples, and approximately the same results were obtained.

Figure 8:
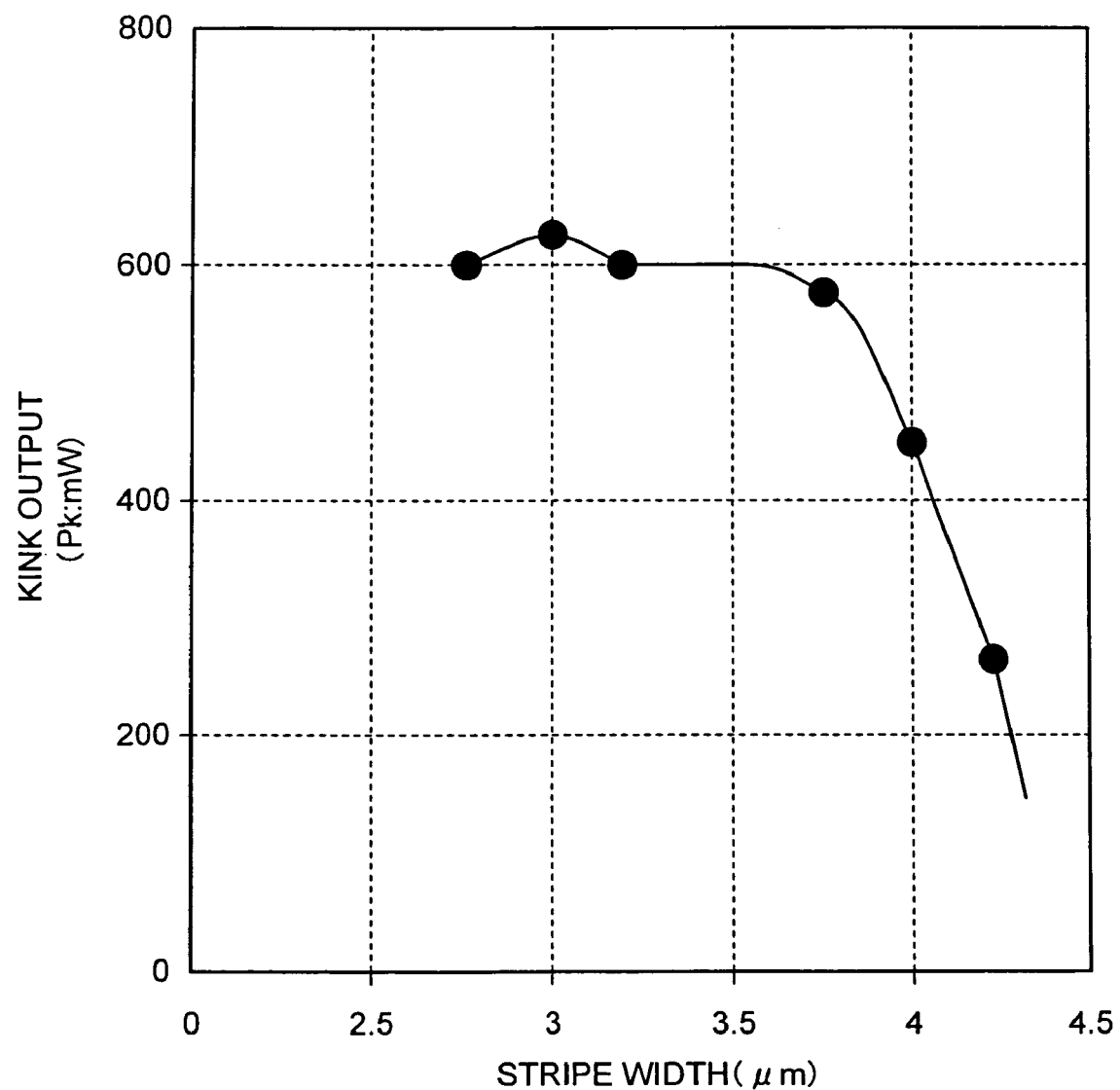
FIG. 8 is a graph of a relation between a stripe width of a current blocking layer and a kink output.

Furthermore, in the layer structure of the second sample, a semiconductor laser element with a stripe width in the current blocking layer 8 being changed was made. FIG. 8 is a graph as a diagram of a relation of a kink output (Pk: milliwatt) with the stripe width by measuring a light-current characteristic of the semiconductor laser.

Approximately the same results were obtained those as for the semiconductor laser elements of the first and third samples shown in FIG. 8.

From the semiconductor laser element of the second sample having the DCH structure shown in Table 1, various laser elements shown in Tables 3 to 5 were made with $\Gamma/d$ being changed by changing the thickness of the well layers and also with the cavity length (L) being changed. With the use of these semiconductor laser elements, laser modules similar to those with the use of the semiconductor laser elements of the first to third samples were made.

TABLE 3

| Semiconductor laser element | | | | Sample 5 | Sample 6 | Sample 7 | Sample 8 |
|---|---|---|---|---|---|---|---|
| Substrate 1 | | | Material | n-GaAs | n-GaAs | n-GaAs | n-GaAs |
| | | | Thickness (nm) | $1 \times 10^5$ | $1 \times 10^5$ | $1 \times 10^5$ | $1 \times 10^5$ |
| Lower clad layer 2A | | | Material | n-AlGaAs | n-AlGaAs | n-AlGaAs | n-AlGaAs |
| | | | Thickness (nm) | 2090 | 2130 | 2340 | 2240 |
| Layer structure D | Lower-light confining layer 7A | | Material | n-GaAs | n-GaAs | n-GaAs | n-GaAs |
| | | | Thickness (nm) | 630 | 640 | 340 | 465 |
| | Lower-carrier blocking layer 6A | | Material | n-AlGaAs | n-AlGaAs | n-AlGaAs | n-AlGaAs |
| | | | Thickness (nm) | On the order of 10–100 | On the order of 10–100 | On the order of 10–100 | On the order of 10–100 |
| | Active layer 5 | Side barrier layer $5B_1$ | Material | i-GaAs | i-GaAs | i-GaAs | i-GaAs |
| | | | Thickness (nm) | 55 | 45 | 50 | 45 |
| | | Well layer $5A_1$ | Material | i-InGaAs | i-InGaAs | i-InGaAs | i-InGaAs |
| | | | Thickness (nm) | 10 | 12 | 12 | 12 |
| | | Side barrier layer $5B_0$ | Material | i-GaAs | i-GaAs | i-GaAs | i-GaAs |
| | | | Thickness (nm) | 6 | 6 | 6 | 6 |
| | | Well layer $5A_2$ | Material | i-InGaAs | i-InGaAs | i-InGaAs | i-InGaAs |
| | | | Thickness (nm) | 10 | 12 | 12 | 12 |
| | | Side barrier layer $5B_2$ | Material | i-GaAs | i-GaAs | i-GaAs | i-GaAs |
| | | | Thickness (nm) | 55 | 45 | 50 | 45 |
| | Lower-carrier block layer 6B | | Material | p-AlGaAs | p-AlGaAs | p-AlGaAs | p-AlGaAs |
| | | | Thickness (nm) | On the order of 10–100 | On the order of 10–100 | On the order of 10–100 | On the order of 10–100 |
| | Lower-light confining layer 7B | | Material | p-GaAs | p-GaAs | p-GaAs | p-GaAs |
| | | | Thickness (nm)(*) | 630 | 640 | 340 | 465 |
| Current blocking layer 8 | | | Material | n-AlGaAs | n-AlGaAs | n-AlGaAs | n-AlGaAs |
| | | | Thickness (nm) | 10–300 | 10–300 | 10–300 | 10–300 |
| Upper clad layer 2B | | | Material | p-AlGaAs | p-AlGaAs | p-AlGaAs | p-AlGaAs |
| | | | Thickness (nm) | 800 | 790 | 1660 | 840 |
| Contact Layer 3 | | | Material | p-GaAs | p-GaAs | p-GaAs | p-GaAs |
| | | | Thickness (nm) | $1.7 \times 10^3$ | $1.7 \times 10^3$ | $1.7 \times 10^3$ | $1.7 \times 10^3$ |
| $\Gamma/d$ (nm$^{-1}$) | | | | 0.595238 | 0.588235 | 0.877193 | 0.961538 |
| $\Delta Ec$ (meV) | | | | 110 | 106 | 106 | 106 |

(*)In FIG. 2, the entire thickness including the current blocking layer

TABLE 4

| Semiconductor laser element | | | | Sample 9 | Sample 10 | Sample 11 | Sample 12 |
|---|---|---|---|---|---|---|---|
| Substrate 1 | | | Material | n-GaAs | n-GaAs | n-GaAs | n-GaAs |
| | | | Thickness (nm) | $1 \times 10^5$ | $1 \times 10^5$ | $1 \times 10^5$ | $1 \times 10^5$ |
| Lower clad layer 2A | | | Material | n-AlGaAs | n-AlGaAs | n-AlGaAs | n-AlGaAs |
| | | | Thickness (nm) | 2380 | 2340 | 2250 | 2590 |
| Layer structure D | Lower-light confining layer 7A | | Material | n-GaAs | n-GaAs | n-GaAs | n-GaAs |
| | | | Thickness (nm) | 400 | 340 | 475 | 475 |
| | Lower-carrier blocking layer 6A | | Material | n-AlGaAs | n-AlGaAs | n-AlGaAs | n-AlGaAs |
| | | | Thickness (nm) | On the order of 10–100 | On the order of 10–100 | On the order of 10–100 | On the order of 10–100 |
| | Active layer 5 | Side barrier layer $5B_1$ | Material | i-GaAs | i-GaAs | i-GaAs | i-GaAs |
| | | | Thickness (nm) | 50 | 50 | 50 | 50 |
| | | Well layer $5A_1$ | Material | i-InGaAs | i-InGaAs | i-InGaAs | i-InGaAs |
| | | | Thickness (nm) | 12 | 12 | 12 | 12 |
| | | Side barrier layer $5B_0$ | Material | i-GaAs | i-GaAs | i-GaAs | i-GaAs |
| | | | Thickness (nm) | 6 | 6 | 6 | 6 |
| | | Well layer $5A_2$ | Material | i-InGaAs | i-InGaAs | i-InGaAs | i-InGaAs |
| | | | Thickness (nm) | 12 | 12 | 12 | 12 |
| | | Side barrier layer $5B_2$ | Material | i-GaAs | i-GaAs | i-GaAs | i-GaAs |
| | | | Thickness (nm) | 50 | 50 | 50 | 50 |
| | Lower-carrier blocking layer 6B | | Material | p-AlGaAs | p-AlGaAs | p-AlGaAs | p-AlGaAs |
| | | | Thickness (nm) | On the order of 10–100 | On the order of 10–100 | On the order of 10–100 | On the order of 10–100 |
| | Lower-light confining layer 7B | | Material | p-GaAs | p-GaAs | p-GaAs | p-GaAs |
| | | | Thickness (nm)(*) | 400 | 340 | 475 | 475 |
| Current blocking layer 8 | | | Material | n-AlGaAs | n-AlGaAs | n-AlGaAs | n-AlGaAs |
| | | | Thickness (nm) | 10–300 | 10–300 | 10–300 | 10–300 |
| Upper clad layer 2B | | | Material | p-AlGaAs | p-AlGaAs | p-AlGaAs | p-AlGaAs |
| | | | Thickness (nm) | 1470 | 1660 | 840 | 830 |
| Contact layer 3 | | | Material | p-GaAs | p-GaAs | p-GaAs | p-GaAs |
| | | | Thickness (nm) | $1.7 \times 10^3$ | $1.7 \times 10^3$ | $1.7 \times 10^3$ | $1.7 \times 10^3$ |
| | $\Gamma/d$ (nm$^{-1}$) | | | 0.869565 | 0.87793 | 0.917431 | 0.925926 |
| | $\Delta Ec$ (meV) | | | 106 | 190 | 106 | 106 |

(*)In FIG. 2, the entire thickness including the current blocking layer

TABLE 5

| Semiconductor layer element | | | | Sample 13 | Sample 14 | Sample 15 |
|---|---|---|---|---|---|---|
| Substrate 1 | | | Material | n-GaAs | n-GaAs | n-GaAs |
| | | | Thickness (nm) | $1 \times 10^5$ | $1 \times 10^5$ | $1 \times 10^5$ |
| Lower clad layer 2A | | | Material | n-AlGaAs | n-AlGaAs | n-AlGaAs |
| | | | Thickness (nm) | 2590 | 2230 | 2590 |
| Layer structure D | Lower-light confining layer 7A | | Material | n-GaAs | n-GaAs | n-GaAs |
| | | | Thickness (nm) | 480 | 560 | 475 |
| | Lower-carrier blocking layer 6A | | Material | n-AlGaAs | n-AlGaAs | n-AlGaAs |
| | | | Thickness (nm) | On the order of 10–100 | On the order of 10–100 | On the order of 10–100 |
| | Active layer 5 | Side barrier layer $5B_1$ | Material | i-AlGaAs | i-GaAs | i-GaAs |
| | | | Thickness (nm) | 50 | 50 | 50 |

TABLE 5-continued

| Semiconductor layer element | | | Sample 13 | Sample 14 | Sample 15 |
|---|---|---|---|---|---|
| | Well layer $5A_1$ | Material Thickness (nm) | i-InGaAs 7 | i-InGaAs 7 | i-InGaAs 7 |
| | Side barrier layer 5B | Material Thickness (nm) | i-GaAs 6 | i-GaAs 6 | i-GaAs 6 |
| | Well layer $5A_2$ | Material Thickness (nm) | i-InGaAs 7 | i-InGaAs 7 | i-InGaAs 7 |
| | Side barrier layer $5B_2$ | Material Thickness (nm) | i-AlGaAs 50 | i-GaAs 50 | i-GaAs 50 |
| Lower-carrier blocking layer 6B | | Material Thickness (nm) | p-AlGaAs On the order of 10–100 | p-AlGaAs On the order of 10–100 | p-AlGaAs On the order of 10–100 |
| Lower-light confining layer 7B | | Material Thickness (nm)(*) | p-GaAs 480 | p-GaAs 560 | p-GaAs 475 |
| Current blocking layer 8 | | Material Thickness (nm) | n-AlGaAs 10–300 | n-AlGaAs 10–300 | n-AlGaAs 10–300 |
| Upper clad layer 2B | | Material Thickness (nm) | p-AlGaAs 830 | p-AlGaAs 830 | p-AlGaAs 830 |
| Contact layer 3 | | Material Thickness (nm) | p-GaAs $1.7 \times 10^3$ | p-GaAs $1.7 \times 10^3$ | p-GaAs $1.7 \times 10^3$ |
| $\Gamma/d$ (nm$^{-1}$) | | | 0.588235 | 0.657895 | 0.934579 |
| $\Delta Ec$ (meV) | | | 202 | 118 | 118 |

(*)In FIG. 2, the entire thickness including the current blocking layer

With the laser element being oscillated, oscillation spectrums of the oscillation laser light were measured observing whether multimode is achieved. All semiconductor laser elements of fifth to fifteenth samples indicated an oscillation spectrum as depicted in FIG. 6.

Figure 9:
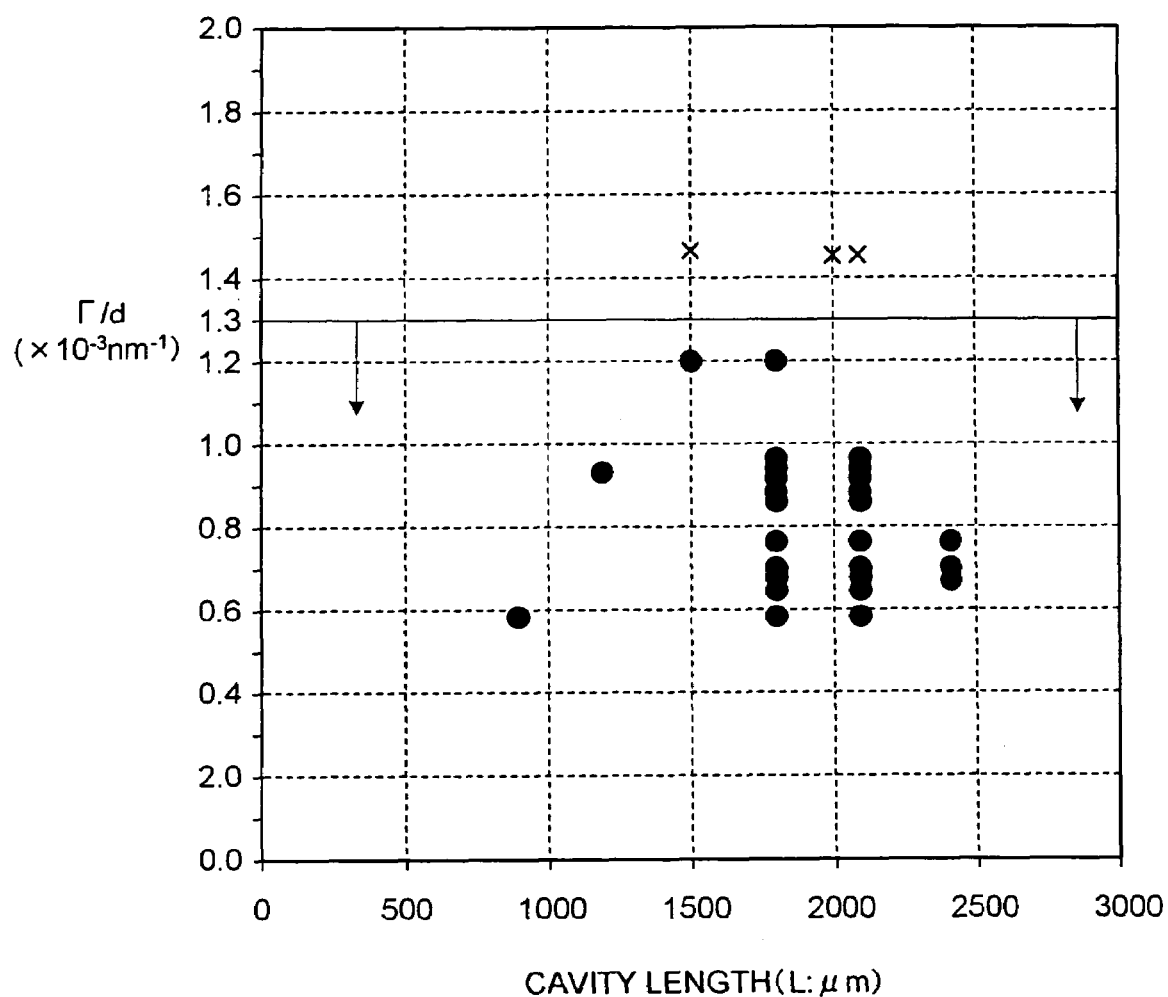
FIG. 9 is a graph of a $\Gamma/d$ vs. a cavity length (L) of multimode semiconductor laser elements of fifth to fifteenth samples.

FIG. 9 is a graph of points plotted on coordinates defined by coordinate axes of the cavity length (L) and $\Gamma/d$ ($\times 10^{-3}$ nm$^{-1}$). In the graph, □ marks indicate the fifth sample, + marks indicate the sixth and thirteenth sample, ∆ marks indicate the seventh and tenth samples, × marks indicate the eighth sample, * marks indicate the ninth sample, – marks indicate the eleventh sample, ○ marks indicate the twelfth sample, ▲ marks indicate the fourteenth sample, and ■ marks indicate the fifteenth sample. For reference, the results obtained with the semiconductor laser element of the fourth sample are shown as black-diamond marks in FIG. 9.

As evident from FIG. 9, the semiconductor laser element of each sample designed so that the $\Gamma/d$ values is equal to or less than 1.3×10-3 nm-1 is independent from the length of the cavity length (L) and, as shown in FIG. 6, oscillates in a plurality of longitudinal modes (multimode) with stable light outputs. From this, to achieve multimode of the oscillation spectrum, that is, to achieve stable light outputs, it is evident that setting the $\Gamma/d$ values as equal to or less than $1.3 \times 10^{-3}$ nm$^{-1}$ is effective.

Figure 10:
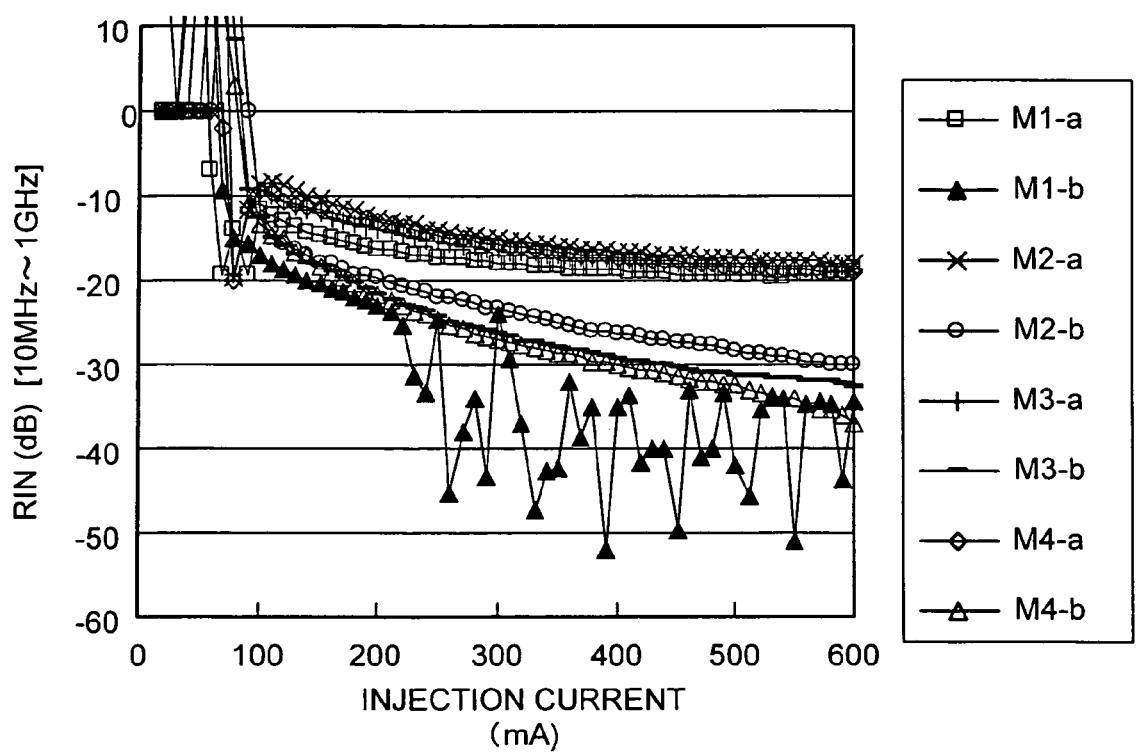
FIG. 10 is a graph of a relation between RIN and an injection current in a high frequency range.

Next, the relation between the RIN in a high frequency range and output fluctuations in low frequencies, which is a feature of the present invention, is described. FIG. 10 is a graph of the relation between the RIN and the injection current in a high frequency range. Particularly, in FIG. 10, a relation between a total RIN from 10 MHz to 1 GHz (hereinafter, "high-frequency RIN") and the injection current to the semiconductor laser element is shown for each of different laser modules M1-a, M1-b, M2-a, M2-b, M3-a, M3-b, M4-a, and M4-b. In FIG. 10, M2 (M2-a and M2-b), M3 (M3-a and M3-b), and M4 (M4-a and M4-b) are laser modules made with the same design parameters, while M1 (M1-a and M1-b) are laser modules with design parameters different from those of the above laser modules. Also, between M1-a and M1-b, the polarization state of the laser light propagating between the FBG and the semiconductor laser element is different. Specifically, in M1-a, the polarization state of the returned light from the FBG coincides with the polarization state of the laser light immediately after being emitted from the semiconductor laser element, while these states are most deviated from each other in M1-b. The same-goes for M2-a and M2-b, M3-a and M3-b, and M4-a and M4-b.

All graphs with figure numbers of FIG. 10 and thereafter each indicate measurement results obtained from a laser module having an FBG and being designed to have a wavelength selection characteristic in which a reflectivity is 4%, a reflection bandwidth is 0.5 nanometers, and a center wavelength is 975 nanometers. Also, the graph shown in FIG. 10 indicates calculation results of RIN (relative intensity noise) obtained by detecting light outputs from the semiconductor laser modules with PD (PIN diode DSC40S manufactured by Discovery Semiconductors, Inc.) and reading, from 10 MHz to 1 GHz, light outputs of AC components with powermeters (E4418 EPM series powermeter and E4412A E series CW power sensor manufactured by Agilent Technologies, Inc.) and light outputs of DC components with a digital multimeter (TR6846 manufactured by Advantest Corporation).

Figure 11A:
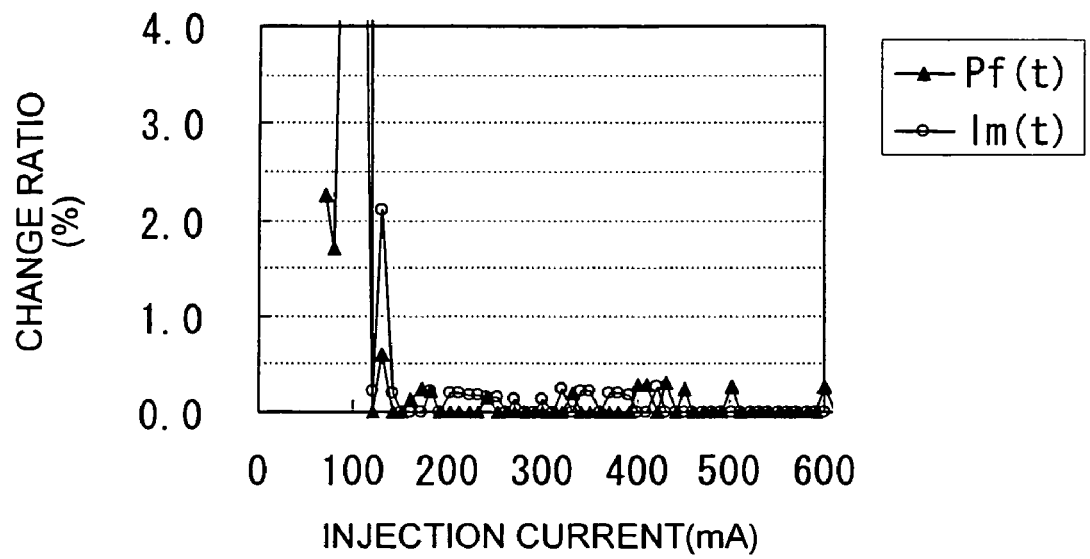
FIGS. 11A and 11B are graphs of a relation between a fluctuation ratio of output light and an injection current of the laser module M1-$a$ and M1-$b$ shown in FIG. 10 in a low frequency range.
Figure 11B:
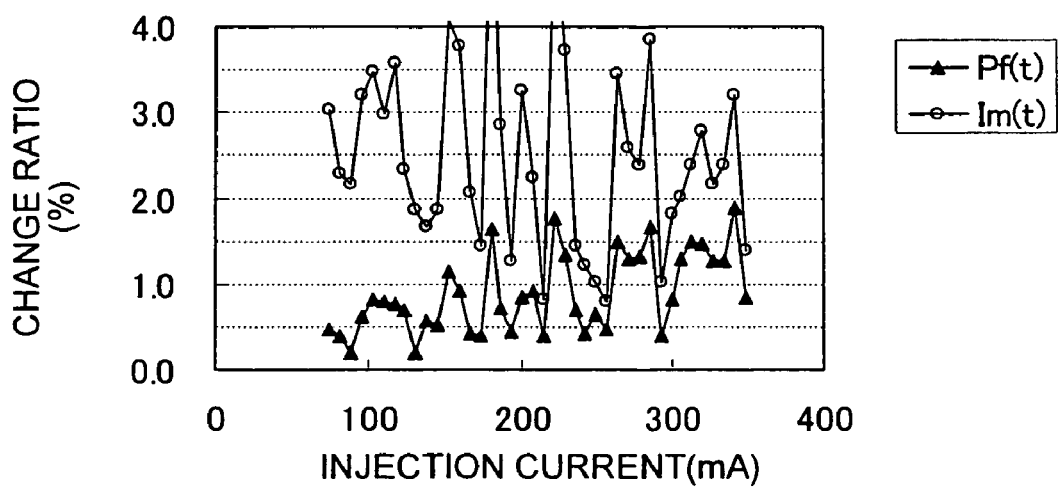
Figure 12A:
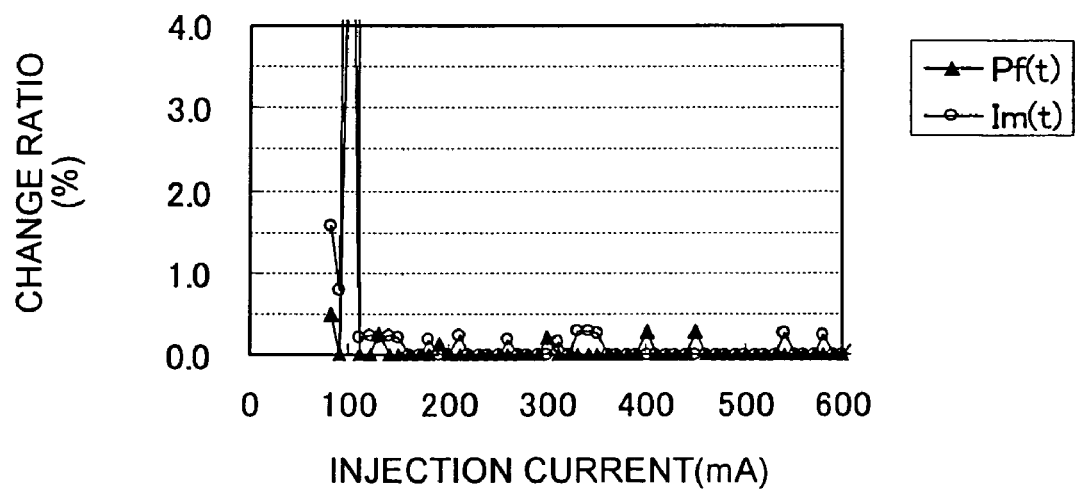
FIGS. 12A and B are graphs of a relation between a fluctuation ratio of output light and an injection current of the laser module M2-$a$ and M2-$b$ shown in FIG. 10 in the low frequency range.
Figure 12B:
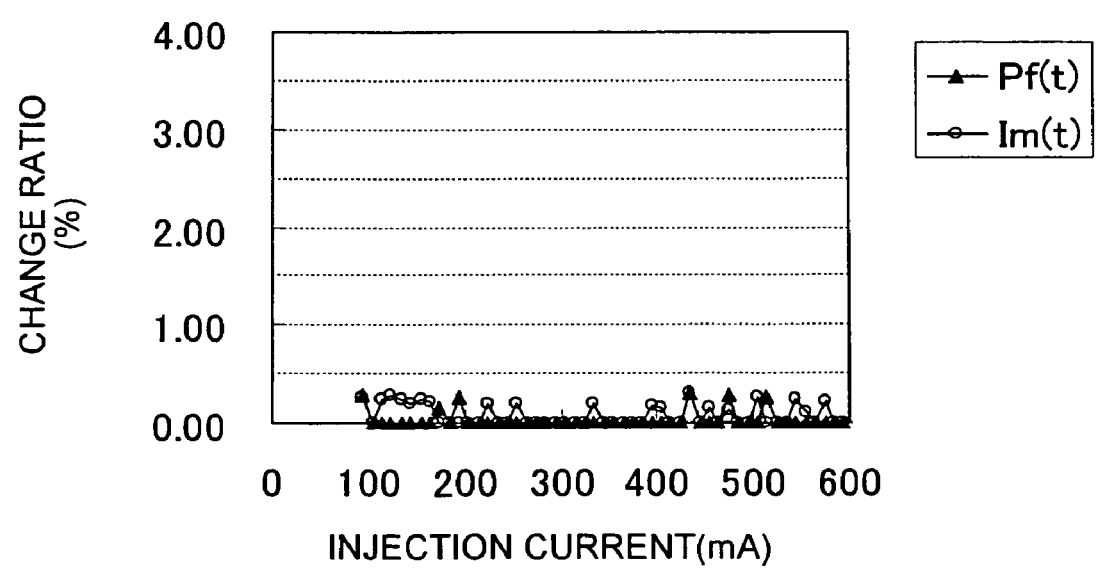

In FIGS. 11A and 11B are graphs of a relation between a change ratio of output light and the injection current in low frequencies for the laser modules M1-a and M1-b, respectively, shown in FIG. 10. FIGS. 12A and 12B are graphs of a relation between a change ratio of output light and the injection current in low frequencies for the laser modules M2-*a* and M2-*b*, respectively, shown in FIG. 10. These graphs depicted in FIGS. 11A to 12B indicate measurement results of temporal output fluctuations obtained while detecting a light output from the semiconductor laser module with the PD and monitoring a monitor current of the photodiode 27 shown in FIG. 1 with an oscilloscope. P(f) represents fluctuations in light output, and lm(t) represents fluctuations in monitor current. The polarization state was adjusted by disposing a polarization controller (Pola RITE manufactured by General Photonics Corporation) between the FBG and the semiconductor laser element.

First, here, when a coherence-collapse phenomenon occurs, it is known that high-frequency noise occurs depending on the distance between the semiconductor laser element and the FBG. That is, it can be determined that, as high-frequency noise is larger, the degree of occurrence of a coherence-collapse phenomenon is larger. From this knowledge, FIG. 10 can also be said to represent the degree of occurrence of a coherence-collapse phenomenon.

On the other hand, in FIGS. 11A to 12B, temporal fluctuation in light output and monitor current in low frequencies. It is assumed herein that a tolerance in temporal fluctuations in light output is equal to or less than 0.5% and a tolerance in temporal fluctuations in monitor current is equal to or less than 1%. As shown in FIGS. 12A and 12B, a stable operation with small fluctuations is achieved with the injection current being equal to or more than a current of near 100 milliamperes in any polarized state of the laser module M2. As for the laser modules M3 and M4, since the same design parameters as those of the laser modules M2 are used, a similar characteristic is shown. However, as for the laser modules M1, while M1-*a* in a coincident polarized state satisfies stability as shown in FIG. 11A, it is evident from FIG. 11B that M1-*b* in a shifted polarized state does not satisfy specification requirements. Again, in FIG. 10, a high-frequency RIN of each of M1-*a*, M2-*a*, M2-*b*, M3-*a*, M3-*b*, M4-*a*, and M4-*b* within the tolerances in FIGS. 11A to 12B is equal to or more than −40. From this result, the inventors have found that stable light outputs in low frequencies can be obtained if a total RIN from −10 MHz to 1 GHz in a high frequency range is equal to or more than −40 dB.

Next, as for laser modules achieving a coherence-collapse phenomenon and stable light outputs in low frequencies, such as the laser modules M2, M3, and M4 described above, a relation between their light output and a polarizing angle of laser light incident in the optical fiber 24 is described.

Figure 13:
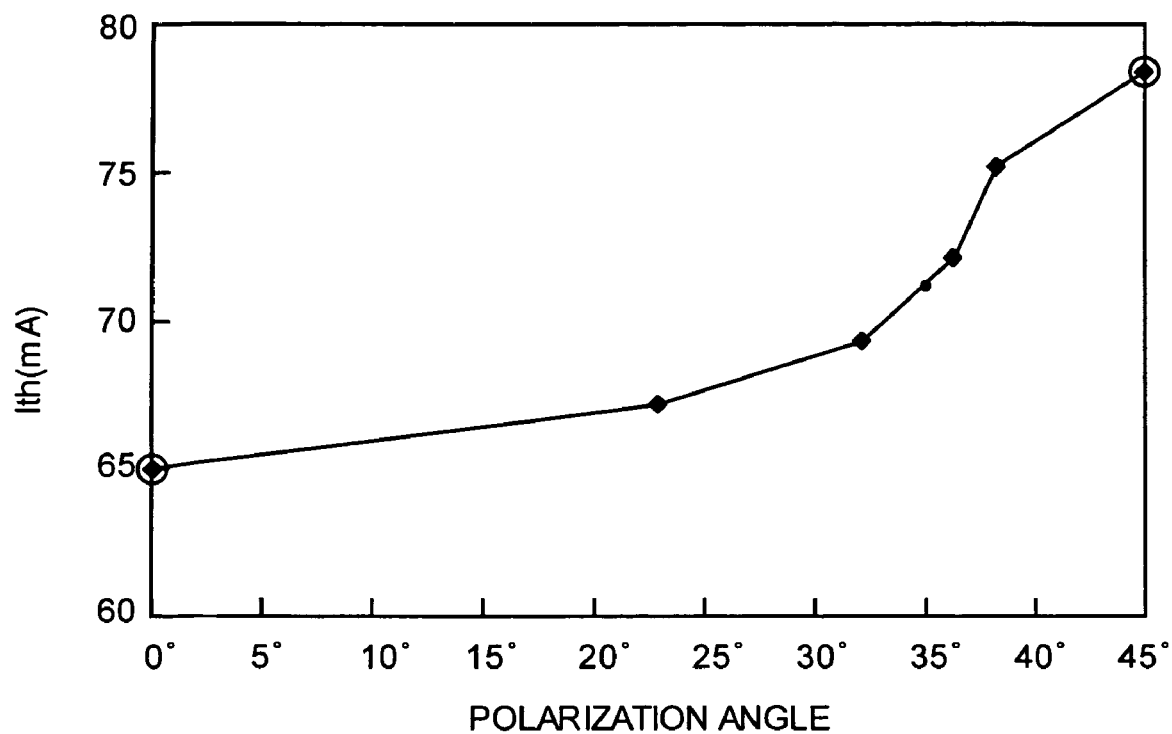
FIG. 13 is a graph of a relation between a threshold current of the semiconductor laser element and a polarizing angle of laser light incident in an optical fiber.

FIG. 13 is a graph of a correspondence between a threshold current ($I_{th}$) of the semiconductor laser element 100 and a polarizing angle of the laser light incident in the optical fiber. As shown in FIG. 13, it is generally known that the polarizing angle of the laser light incident in the optical fiber 24 makes its presence known as a difference in threshold current of the semiconductor laser element 100. Particularly, FIG. 13 represents mapping data generated from several measured values of the polarizing angle and the threshold current and, in the following, polarizing angles of 0 degree, 35 degrees, and 45 degrees corresponding to threshold currents of 64.9 milliamperes, 71.0 milliamperes, and 78.1 milliamperes, respectively, are regarded as polarizing angles for analysis.

FIG. 14 is a graph of a relation between a fluctuation ratio of light outputs and an injection current in low frequencies for each different polarizing angle. As shown in FIG. 14, it is clear that, when the threshold current is other than 64.9 milliamperes, that is, when the polarizing angle is other than 0 degree, the fluctuation ratio of light outputs is equal to or less than 0.5% with any injection current, thereby achieving extremely stable laser light. Also, even when the polarizing angle is 0 degree, the laser light is stable with the injection current of 100 milliamperes. This means that stable light outputs can be achieved in low frequencies at any polarizing angle at the time of high outputs of the laser module.

Figure 15A:
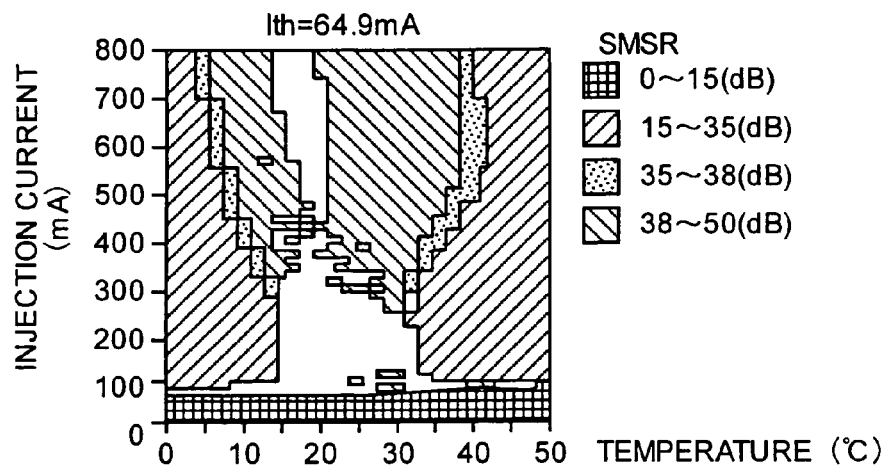
FIGS. 15A, 15B, and 15C are graphs of a mutual relation between an injection current, temperature, and SMSR for each different polarizing angle.
Figure 15B:
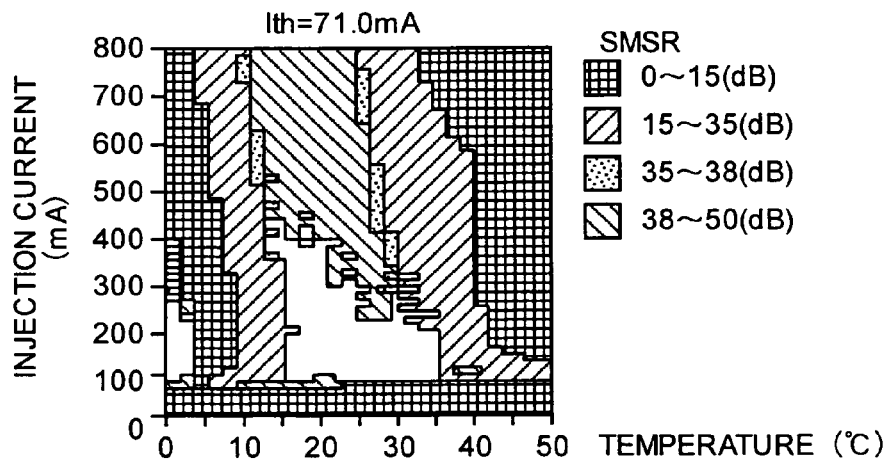
Figure 15C:
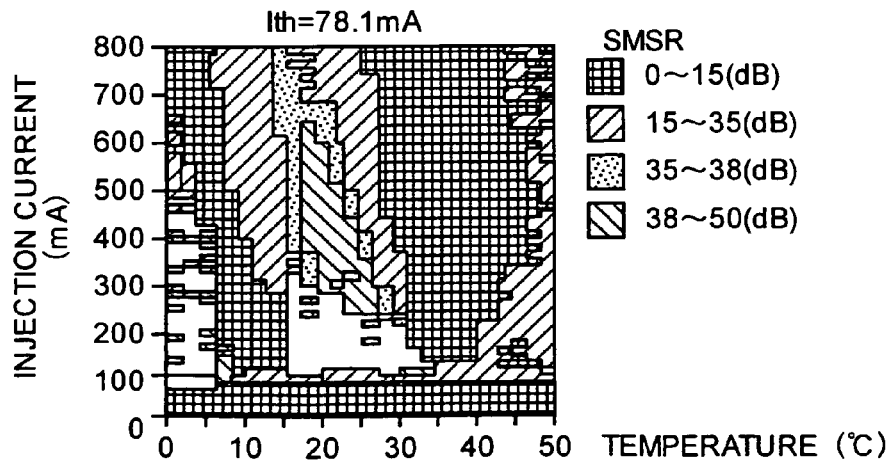

FIGS. 15A, 15B, and 15C indicate graphs depicting a mutual relation between an injection current, temperature, and SMSR for each polarizing angle. Particularly, FIG. 15A indicates the SMSR when the threshold current is 64.9 milliamperes, that is, the polarizing angle is 0 degree, FIG. 15B indicates the SMSR when the threshold current is 71.0 milliamperes, that is the polarizing angle is 35 degrees, and FIG. 15C indicates the SMSR when the threshold current is 78.1 milliamperes, that is the polarizing angle is 45 degrees.

As shown in FIGS. 15A to 15C, in any polarized state, the SMSR is larger than 0 decibel in a range of practical environment temperatures. Therefore, in the laser module according to the present invention, as evident from FIGS. 14 to 15C, even with different polarized state, stabilization of light outputs in low frequencies and oscillation with an FBG used as a main mode are simultaneously achieved.

Particularly, it is evident from FIGS. 15A to 15C that, even when the polarizing angle of the returned light is changed in a range of 0 degree to 45 degrees, in other words, even when the current threshold of the laser module is changed according to the polarized state, the present laser module shows a stable characteristic. Particularly, the inventors have found that, even when the current threshold of the laser module shows any current value calculated as being equal to or less than 90% to 95% of the current threshold of the semiconductor laser element according to the polarized state of the returned light, the laser module according to the present invention shows a stable characteristic. In the example shown in FIGS. 15A to 15C, the laser module shows a stable operation even if the polarizing angle is changed from 0 degree to 45 degrees and the current threshold of the laser module is accordingly changed up to approximately 83% (=64.9 milliamperes/78.1 milliamperes) of the current threshold of the semiconductor laser element.

Furthermore, the inventors and others have found that, by using the laser module satisfying the above design parameters, advantageous use conditions can be achieved also for parameters regarding an external cavity formed with the FBG. Such advantageous use conditions mean that, when an effective reflectivity $R_{\mathit{eff}}$ of the fiber Bragg grating is represented as $R_{\mathit{eff}} = \eta^2 R_g$ with a coupling efficiency $\eta$ between the semiconductor laser element and the optical fiber and a reflectivity $R_g$ of the FBG and a reflectivity of a front end surface (emission facet) of the semiconductor laser element is represented as $R_{\mathit{chip}}$, a relation between the effective reflectivity $R_{\mathit{eff}}$ and the reflectivity $R_{\mathit{chip}}$ of the front facet is not restricted as in the conventional technologies. It is generally known that, in a conventional laser module optically coupling to an FBG, characteristics as specified cannot be achieved if a relation of $R_{\mathit{chip}} \geq 3R_{\mathit{eff}}$ is not satisfied. By contrast, in the laser module according to the present invention, even if not only the relation of $R_{\mathit{chip}} \geq 3R_{\mathit{eff}}$ but also a relation of $$R_{\mathit{chip}} < 3R_{\mathit{eff}} \qquad (2)$$

is satisfied, laser oscillation according to the specification requirements can be achieved.

As has been described above, according to the first embodiment, in the laser module including at lease the semiconductor laser element 100 having the DCH structure and the FBG 24*a*, by satisfying a condition in which a total RIN in a high frequency range is equal to or not less than a predetermined value, a coherence-collapse phenomenon and sufficient monochromatic characteristic can be simultaneously achieved, thereby realizing sufficiently-stable light outputs in low frequencies. Furthermore, laser modules under the same conditions can have a characteristic satisfying an SMSR even with any polarized state of returned light occurring due to a kink of the optical fiber or the like, that is, even with fluctuations in threshold current that occur accordingly.

In the description of the first embodiment above, measurement results have been shown when the cavity length fd between the FBG 24a and the semiconductor laser element 100 is assumed to be 1 meter. Therefore, if the cavity length fd has a different value, the conditions for achieving stabilization of light outputs in low frequencies are different. For example, in the above example, a laser module with a total RIN from 10 MHz to 1 GHz in a high frequency range being equal to or more than −40 dB is shown. If the cavity length is 2 meters, a condition is that a total RIN from 5 MHz to 500 MHz in a high frequency range is equal to or more than −40 dB. As such, the high-frequency range where a total RIN is to be calculated has to be changed according to the cavity length. At any rate, as long as a total RIN in predetermined a high frequency range is equal to or more than −40 dB, the correlation in which stable light outputs can be achieved in low frequencies is not changed. However, a lower limitation of the high-frequency range described above has to be a frequency that is high enough to have an influence on at least a frequency band of using laser light to be emitted.

While the laser module according to the first embodiment includes a semiconductor laser element having a DCH structure, the laser module according to a second embodiment of the present invention has a feature of including a semiconductor laser element having an SCH structure. Particularly, also in the second embodiment, the correlation in which stable light outputs can be achieved in low frequencies is kept as long as a total RIN in predetermined a high frequency range is equal to or more than −40 dB. Also, the design parameters required for achieving this can be easily determined within a range of the detailed description of the first embodiment. Therefore, only the SCH structure is described herein, and the description of effects and others in the first embodiment are referred to herein.

Figure 16:
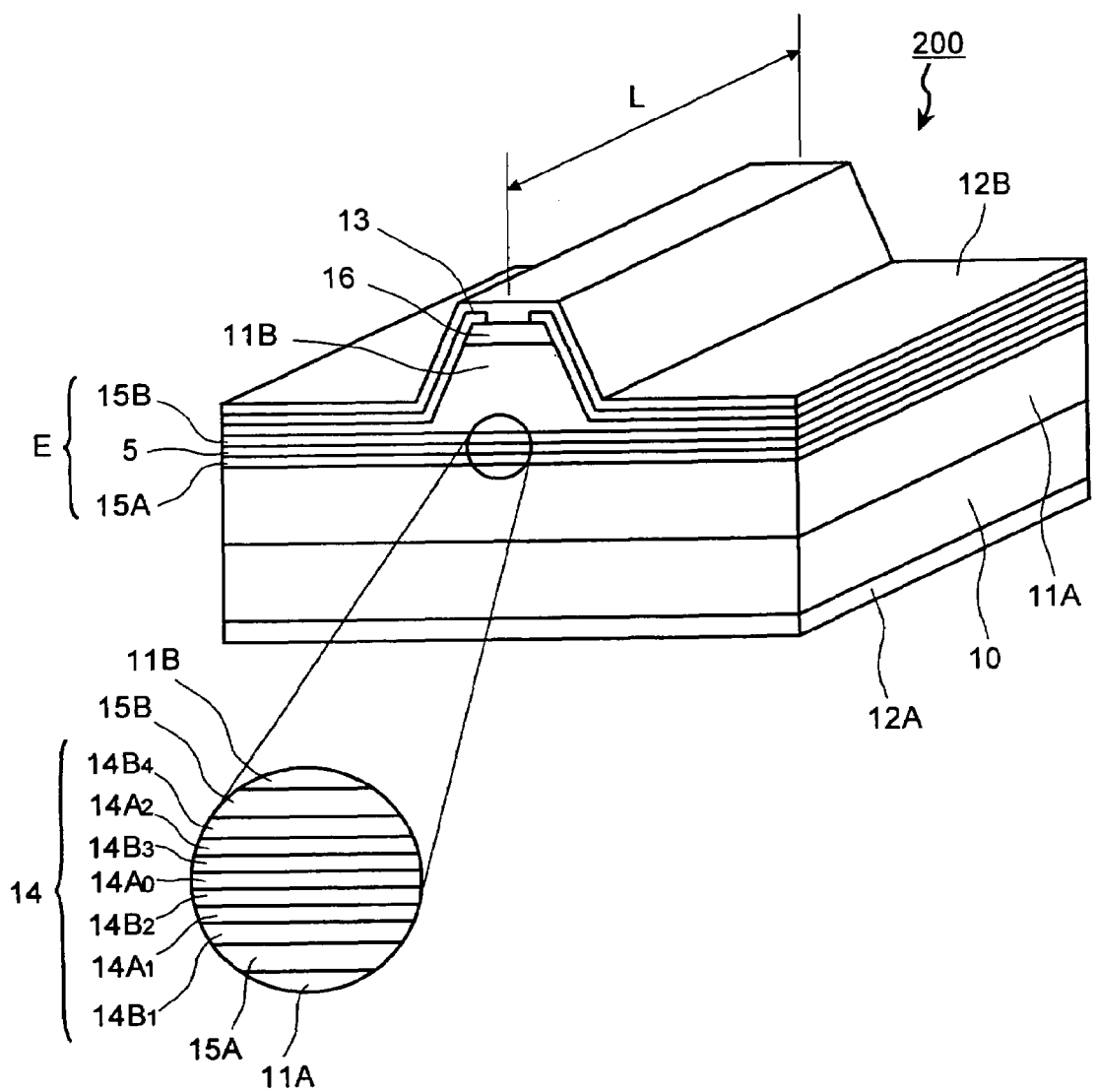
FIG. 16 is a perspective view of a laser module according to a second embodiment of the present invention having an SCH structure.

FIG. 16 is a perspective view of a laser module according to a second embodiment of the present invention having an SCH structure. As shown in FIG. 16, a semiconductor laser element 200 included in the laser module 200 has an upper portion being shaped like a ridge waveguide and, as a whole, having a predetermined cavity length L. On a substrate 10 made of n-GaAs, a lower clad layer 11A made of n-AlGaAs is formed, on which a layer structure E, which will be described further below, is further formed. On the rear surface of the substrate 10, an n-type electrode 12A is formed. On the upper surface of the layer structure E, a p-type electrode 12B is formed via a protective film 13 made of silicon nitride (SiNx) or the like.

The layer structure E includes an active layer 14 having a quantum well structure including three well layers $14A_0$, $14A_1$, and $14A_2$ made of InGaAs and four barrier layers $14B_1$, $14B_2$, $14B_3$, and $14B_4$ made of GaAsP and disposed on both sides of each well layer. On a side of each of the barrier layers $14B_1$ and $14B_2$ positioned at both ends of the active layer 14, a lower-light confining layer 15A made of AlGaAs and a upper-light confining layer 15B, respectively, are disposed.

Figure 17:
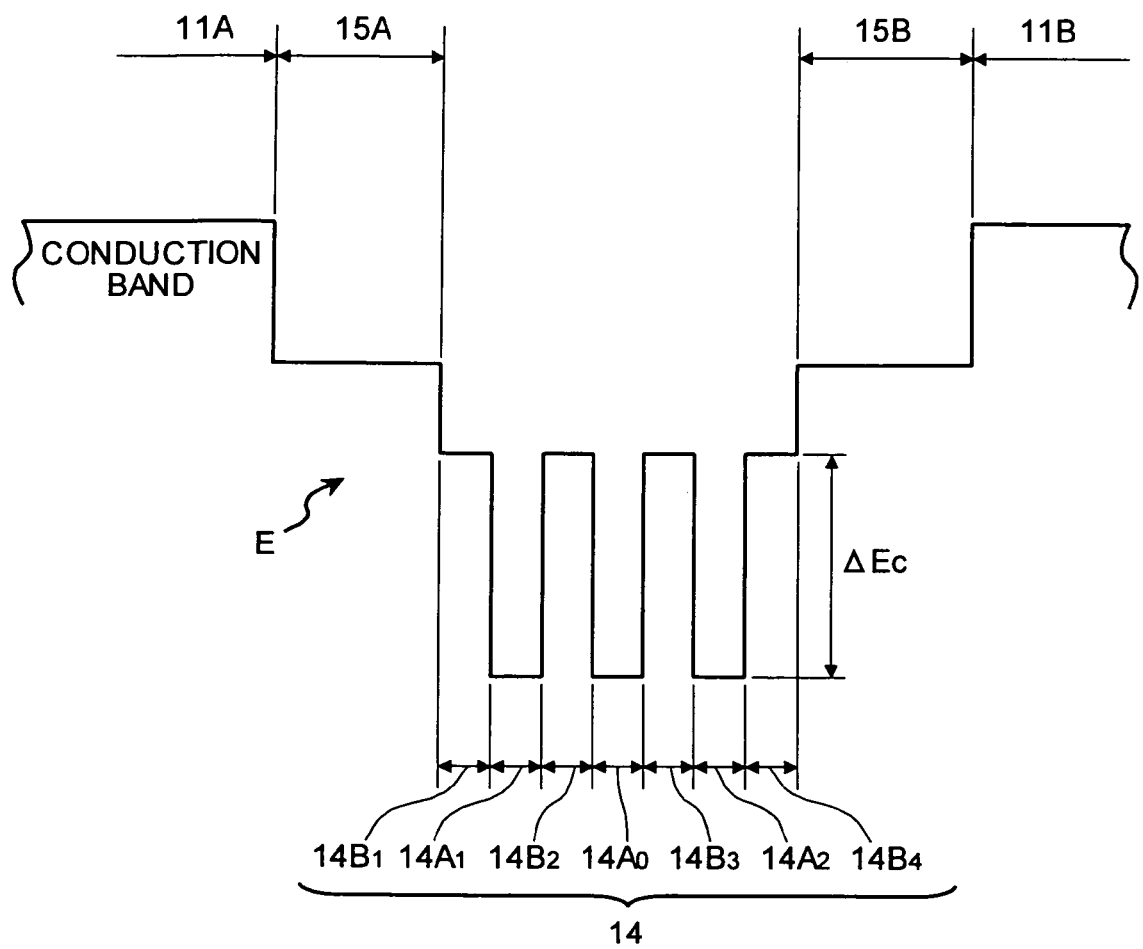
FIG. 17 is a schematic diagram as an example of a band diagram of the SCH structure.

This layer structure E is called a separated confinement heterostructure (SCH structure). FIG. 17 is a schematic diagram as an example of a band diagram of the SCH structure. In the present embodiment, even for the semiconductor laser 200 having such an SCH structure, the SCH structure is designed to satisfy the design items described in the first embodiment.

Specifically, the semiconductor laser element 200 is made according to design items shown in Table 6 below. The cavity length (L) has two types, 1500 micrometers and 2000 micrometers. Also, in these laser elements, the reflectivity of the front facet is set to 1%, and the reflectivity of the rear facet is set to 92%.

TABLE 6

| Semiconductor laser element | | | | Sample 4 |
|---|---|---|---|---|
| Substrate 10 | | | Material | n-GaAs |
| | | | Thickness (nm) | $1 \times 10^5$ |
| Lower clad layer 11A | | | Material | n-AlGaAs |
| | | | Thickness (nm) | $4 \times 10^3$ |
| Layer structure E | Lower-light confining layer 15A | | Material | n-AlGaAs |
| | | | Thickness (nm) | 5 |
| | Active layer 14 | Barrier layer $14B_1$ | Material | i-GaAsP |
| | | | Thickness (nm) | 5 |
| | | Well layer $14A_1$ | Material | i-InGaAs |
| | | | Thickness (nm) | 9 |
| | | Barrier layer $14B_2$ | Material | i-GaAsP |
| | | | Thickness (nm) | 5 |
| | | Well layer $14A_0$ | Material | i-InGaAs |
| | | | Thickness (nm) | 9 |
| | | Barrier layer $14B_3$ | Material | i-GaAsP |
| | | | Thickness (nm) | 5 |
| | | Barrier layer $14A_2$ | Material | i-InGaAs |
| | | | Thickness (nm) | 9 |
| | | Barrier layer $14B_4$ | Material | i-GaAsP |
| | | | Thickness (nm) | 5 |
| | Upper-light confining layer 15B | | Material | p-AlGaAs |
| | | | Thickness (nm) | 5 |
| Upper clad layer 11B | | | Material | p-GaAs |
| | | | Thickness (nm) | $2 \times 10^3$ |
| Contact layer 16 | | | Material | n-GaAs |
| | | | Thickness (nm) | $0.5 \times 10^3$ |

The light confinement coefficient (Γ) for each well layer of these laser elements is 0.011. Therefore, Γ/d is $1.2 \times 10^{-3}$ $nm^{-1}$.

As with the first to third samples shown in Table 1, it was found that the semiconductor laser elements oscillates in a plurality of longitudinal modes (multimode).

For the semiconductor laser element 200, the thickness d of each well layer is a main factor in making the oscillation spectrum of the oscillated laser light in multimode. Specifically, making the thickness d of each well layer is useful for making the oscillation spectrum in multimode. In the laser element 200, the width of the ridge waveguide is adjusted to control an injection current from the p-type electrode 12B.

In the first and second embodiments described above, a feedback optical component forming an external cavity is an FBG. Alternatively, another feedback optical component, such as a half mirror, may be adopted as long as it has a similar function.

As has been described in the foregoing, according to the laser module of the present invention, in the laser module including a semiconductor laser element and a feedback optical component, such as an FBG, forming an external cavity, a condition in which a total RIN in a high frequency range is equal to or more than −40 dB. This achieves effects of simultaneously achieving a coherence-collapse phenomenon and sufficient monochromatic characteristic, achieving sufficiently-stable light outputs in low frequencies and, furthermore, achieving a characteristic that satisfies an SMSR for any fluctuations in threshold current changing according the polarized state of returned light.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A laser module comprising:
a semiconductor laser element; and
a feedback optical component forming an external cavity with the semiconductor laser element, wherein:
the semiconductor laser element is a Fabry-Perot device with a layer structure including an active layer of a quantum well structure that has a well layer and barrier layers laminated on both sides in a lamination direction of the well layer,
the semiconductor laser element having a cavity length not smaller than 1500 μm, and
a light confinement coefficient per well layer of the quantum well structure $\Gamma$ and a thickness of the well layer d in nanometers satisfy $\Gamma/d <= 1.3 \times 10^{-3}$ nm$^{-1}$.

2. The laser module according to claim 1, wherein the layer structure further includes a carrier blocking layer formed outside the active layer in the lamination direction, the carrier blocking layer having a band-gap energy larger than band-gap energies of the barrier layers of the active layer, a light confinement coefficient per well layer of the quantum well structure $\Gamma$ and a thickness of the well layer d in nanometers satisfy $\Gamma/d = 1.3 \times 10^{-3}$ nm$^{-1}$.

3. The laser module according to claim 2, wherein the layer structure further includes a light confining layer formed outside the carrier blocking layer in the lamination direction, the light confining layer having a band-gap energy smaller than the band-gap energy of the carrier blocking layer.

4. The laser module according to claim 3, wherein the layer structure further includes a current blocking layer configured to confine an injection current in the active layer.

5. The laser module according to claim 4, wherein the current blocking layer has a stripe through which the injection current is injected into the active layer.

6. The laser module according to claim 5, wherein a stripe width of the current blocking layer is optimized so that most of an injection carrier is included in a profile area of an oscillated laser light.

7. The laser module according to claim 2, wherein a thickness of the well layer allows a higher order level to be present in the well layer, in addition to a base level.

8. The laser module according to claim 7, wherein the thickness of the well layer is less than a thickness above which an oscillation at a second quantum level occurs.

9. The laser module according to claim 2, wherein:
the well layer is formed of an InGaAs strained-quantum-well,
the carrier blocking layer is formed of AlGaAs, and
the barrier layers located at both ends of the active layer are formed of $Al_xGa_{1-x}As$ where x is not less than 0 and less than 0.1.

10. The laser module according to claim 3, wherein:
the well layer is formed of an InGaAs strained-quantum-well,
the carrier blocking layer is formed of AlGaAs,
the barrier layers located at both ends of the active layer are formed of $Al_xGa_{1-x}As$, where x is not less than 0 and less than 0.1, and
the light confining layer is formed of GaAs.

11. The laser module according to claim 5, wherein:
the well layer is formed of an InGaAs strained-quantum-well,
the carrier blocking layer is formed of AlGaAs,
the barrier layers located at both ends of the active layer are formed of $Al_xGa_{1-x}As$ where x is not less than 0 and less than 0.1,
the light confining layer is formed of GaAs, and
the current blocking layer is formed of AlGaAs.

12. The laser module according to claim 11, wherein a stripe width of the current blocking layer is optimized so that most of an injection carrier is included in a profile area of an oscillated laser light.

13. The laser module according to claim 11, wherein a width of the stripe is not greater than 3.5 μm.

14. The laser module according to claim 9, wherein a thickness of the well layer is not less than 8.5 nanometers.

15. The laser module according to claim 14, wherein the thickness of the well layer is not greater than 12 nanometers.

16. The laser module according to claim 9, wherein a difference between a conduction band energy of the barrier layer and a conduction band energy of the well layer is not less than 95 meV and not greater than 170 meV.

17. The laser module according to claim 2, wherein the feedback optical component is a fiber Bragg grating.

18. The laser module according to claim 17, wherein an effective reflectivity of the fiber Bragg grating $R_{eff} = \eta^2 R_g$ and a reflectivity of a front facet of the semiconductor laser element $R_{chip}$ satisfy:

$$R_{chip} < 3R_{eff},$$

where $R_g$ is a reflectivity of the fiber Bragg grating, and $\eta$ is a coupling efficiency between the fiber Bragg grating and the semiconductor laser element.

19. The laser module according to claim 2, wherein the semiconductor laser element oscillates in a plurality of longitudinal modes.

20. The laser module according to claim 3, wherein the light confining layer is formed on both sides of the active layer.

21. The laser module according to claim 20, wherein the light confining layer has the band-gap energy larger than the band-gap energies of the barrier layers of the active layer.

22. The laser module according to claim 2, wherein the carrier blocking layer is formed on both sides of the active layer.

23. The laser module according to claim 1, wherein the layer structure further includes a light confining layer formed outside the barrier layers in a lamination direction, the light confining layer having a band-gap energy larger than a band-gap energy of the barrier layers.

* * * * *